(12) United States Patent
Ko et al.

(10) Patent No.: US 12,218,096 B2
(45) Date of Patent: Feb. 4, 2025

(54) SEMICONDUCTOR PACKAGE AND METHOD OF FORMING THE SAME

(71) Applicant: SAMSUNG ELECTRONICS CO., LTD., Suwon-si (KR)

(72) Inventors: Yeongkwon Ko, Hwaseong-si (KR); Unbyoung Kang, Hwaseong-si (KR); Soyeon Kwon, Cheonan-si (KR); Yoonsung Kim, Seoul (KR); Teakhoon Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 386 days.

(21) Appl. No.: 17/707,007

(22) Filed: Mar. 29, 2022

(65) Prior Publication Data
US 2023/0048729 A1    Feb. 16, 2023

(30) Foreign Application Priority Data

Aug. 13, 2021   (KR) ......................... 10-2021-0107287

(51) Int. Cl.
| | |
|---|---|
| H01L 23/544 | (2006.01) |
| H01L 23/00 | (2006.01) |
| H01L 25/065 | (2023.01) |
| H01L 25/10 | (2006.01) |
| H01L 25/18 | (2023.01) |

(52) U.S. Cl.
CPC ............ H01L 24/26 (2013.01); H01L 23/544 (2013.01); H01L 24/32 (2013.01); *H01L 24/05* (2013.01); *H01L 24/06* (2013.01); *H01L 24/13* (2013.01); *H01L 24/16* (2013.01); *H01L 24/17* (2013.01); *H01L 24/33* (2013.01); *H01L 24/73* (2013.01); *H01L 25/0657* (2013.01); *H01L 25/105* (2013.01); *H01L 25/18* (2013.01); *H01L 2223/54426* (2013.01); *H01L 2224/05025* (2013.01); *H01L 2224/05073* (2013.01);
(Continued)

(58) Field of Classification Search
CPC ...................................................... H01L 24/26
See application file for complete search history.

(56) References Cited

U.S. PATENT DOCUMENTS

| | | | |
|---|---|---|---|
| 7,361,532 B2* | 4/2008 | Fukazawa | ......... H01L 21/76898 |
| | | | 257/E21.597 |
| 7,518,211 B2 | 4/2009 | Jao | |

(Continued)

*Primary Examiner* — William A Harriston
(74) *Attorney, Agent, or Firm* — Fish & Richardson P.C.

(57) ABSTRACT

A semiconductor package and a method of forming the same are provided. The semiconductor package includes: a semiconductor substrate having a front side and a back side, the semiconductor substrate having a chip area and a dummy area; a front structure below the front side, and including an internal circuit, an internal connection pattern, a guard pattern, and a front insulating structure; a rear protective layer overlapping the chip area and the dummy area, and a rear protrusion pattern on the rear protective layer and overlapping the dummy area, the rear protective layer and the rear protrusion pattern being on the back side; a through-electrode structure penetrating through the chip area and the rear protective layer, and electrically connected to the internal connection pattern; and a rear pad electrically connected to the through-electrode structure. The internal circuit and the internal connection pattern are below the chip area, and the guard pattern is below the chip area adjacent to the dummy area.

20 Claims, 23 Drawing Sheets

(52) U.S. Cl.
CPC ............... *H01L 2224/05562* (2013.01); *H01L 2224/05573* (2013.01); *H01L 2224/06181* (2013.01); *H01L 2224/13082* (2013.01); *H01L 2224/16145* (2013.01); *H01L 2224/16227* (2013.01); *H01L 2224/17181* (2013.01); *H01L 2224/26145* (2013.01); *H01L 2224/26175* (2013.01); *H01L 2224/32145* (2013.01); *H01L 2224/32225* (2013.01); *H01L 2224/33181* (2013.01); *H01L 2224/73253* (2013.01); *H01L 2225/06513* (2013.01)

(56) References Cited

U.S. PATENT DOCUMENTS

| | | | |
|---|---|---|---|
| 8,344,493 B2* | 1/2013 | West | H01L 23/3128 257/621 |
| 8,957,526 B2 | 2/2015 | Chun et al. | |
| 9,029,199 B2 | 5/2015 | Sakurada | |
| 9,721,926 B2 | 8/2017 | Choe et al. | |
| 9,941,252 B2 | 4/2018 | Lee | |
| 10,910,346 B2 | 2/2021 | Hong et al. | |
| 2002/0013061 A1 | 1/2002 | Siniaguine et al. | |
| 2005/0046002 A1 | 3/2005 | Lee et al. | |
| 2006/0138629 A1* | 6/2006 | Fukazawa | H01L 21/76898 438/455 |
| 2013/0221493 A1* | 8/2013 | Kim | H01L 21/6835 257/774 |
| 2013/0256872 A1* | 10/2013 | Su | H01L 23/3677 257/737 |
| 2013/0264720 A1* | 10/2013 | Chun | H01L 21/76898 257/774 |
| 2015/0214110 A1 | 7/2015 | Lin et al. | |
| 2016/0064357 A1* | 3/2016 | Choe | H01L 24/06 438/109 |
| 2016/0293532 A1 | 10/2016 | Wu et al. | |
| 2020/0035618 A1 | 1/2020 | Mao et al. | |
| 2021/0111159 A1 | 4/2021 | Park et al. | |

* cited by examiner

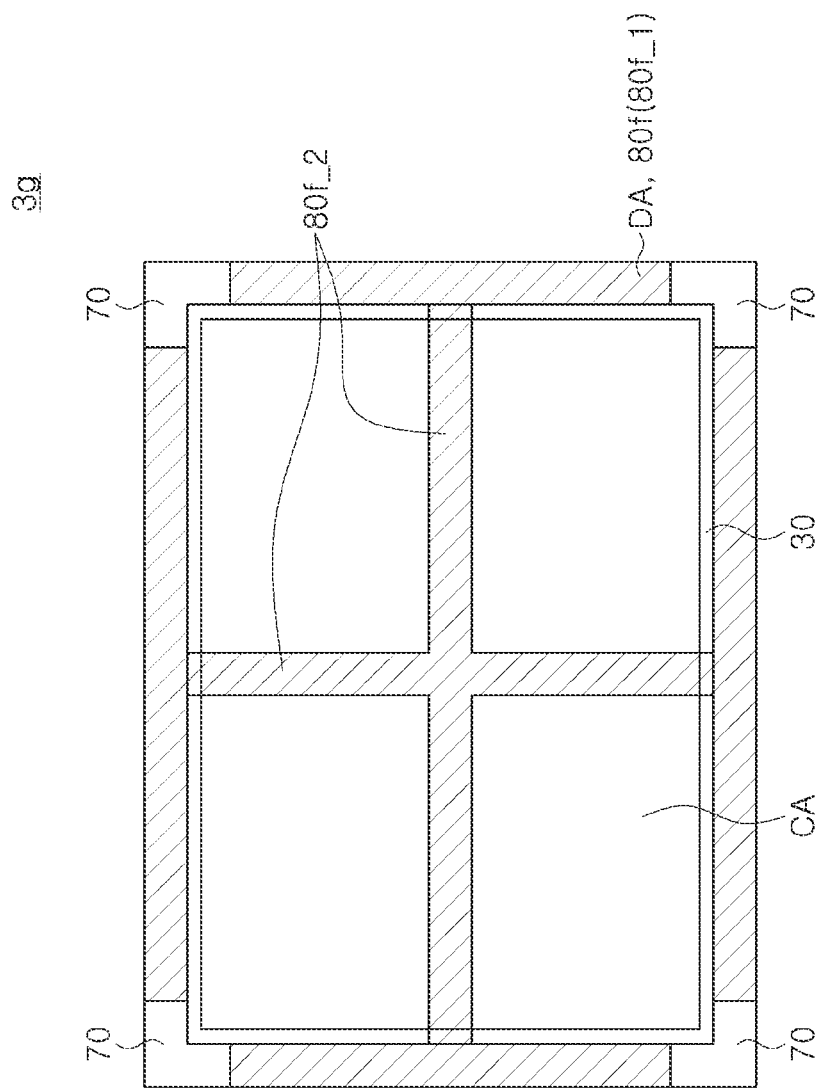

SEMICONDUCTOR PACKAGE AND METHOD OF FORMING THE SAME

CROSS-REFERENCE TO RELATED APPLICATION(S)

This application claims the benefit under 35 USC 119 (a) of Korean Patent Application No. 10-2021-0107287 filed on Aug. 13, 2021 in the Korean Intellectual Property Office, the entire disclosure of which is incorporated herein by reference for all purposes.

BACKGROUND

The present inventive concept relates to a semiconductor package and a method of forming the same.

For weight reduction and the implementation of high performance of electronic devices, miniaturization and high performance are also required in the semiconductor package field as well. To implement miniaturization, weight reduction, high performance, high capacity, and high reliability of semiconductor packages, research into and development of a semiconductor packages having a structure in which semiconductor chips are stacked in multiple stages is currently being undertaken.

SUMMARY

Exemplary embodiments provide a reliable semiconductor package.

Exemplary embodiments provide a method of forming a semiconductor package.

According to exemplary embodiments, a semiconductor package includes a base; a plurality of semiconductor chips stacked on the base in a vertical direction; connection patterns electrically connecting the plurality of semiconductor chips; and adhesive material layers filling at least a space between the plurality of semiconductor chips and covering side surfaces of the connection patterns. The plurality of semiconductor chips include a first semiconductor chip and a second semiconductor chip sequentially stacked in the vertical direction, and the connection patterns include a first connection pattern disposed between the first semiconductor chip and the second semiconductor chip and electrically connecting the first semiconductor chip and the second semiconductor chip. The first semiconductor chip includes a first semiconductor substrate having a first front side and a first back side opposing each other, the first semiconductor substrate having a first chip area and a first dummy area surrounding the first chip area; a first front structure disposed below the first front side of the first semiconductor substrate, and including a first internal circuit, a first guard pattern, a first internal connection pattern, and a first front insulating structure; on the first back side of the first semiconductor substrate, a first rear protective layer overlapping the first chip area and the first dummy area, and a first rear protrusion pattern disposed on the first rear protective layer and overlapping the first dummy area; a first through-electrode structure penetrating through the first chip area of the first semiconductor substrate and the first rear protective layer, and electrically connected to the first internal connection pattern in the first front structure; and a first rear pad electrically connected to the first through-electrode structure, on the first rear protective layer and the first through-electrode structure, and spaced apart from the first rear protrusion pattern. The first internal circuit and the first internal connection pattern are disposed below the first chip area of the first semiconductor substrate, and the first guard pattern is disposed below the first chip area of the first semiconductor substrate adjacent to the first dummy area.

According to exemplary embodiments, a semiconductor package includes a semiconductor substrate having a front side and a back side opposing each other, the semiconductor substrate having a chip area and a dummy area surrounding the chip area; a front structure disposed below the front side of the semiconductor substrate, and including an internal circuit, an internal connection pattern, a guard pattern, and a front insulating structure; a rear protective layer overlapping the chip area and the dummy area, and a rear protrusion pattern disposed on the rear protective layer and overlapping the dummy area, the rear protective layer and the rear protrusion pattern being disposed on the back side of the semiconductor substrate; a through-electrode structure penetrating through the chip area of the semiconductor substrate and the rear protective layer, and electrically connected to the internal connection pattern in the front structure; and a rear pad electrically connected to the through-electrode structure, on the rear protective layer and the through-electrode structure, and spaced apart from the rear protrusion pattern. The internal circuit and the internal connection pattern are disposed below the chip area of the semiconductor substrate, and the guard pattern is disposed below the chip area of the semiconductor substrate adjacent to the dummy area.

According to exemplary embodiments, a semiconductor package includes a substrate having a first surface and a second surface opposing each other, the substrate having a first area and a second area surrounding the first area; a lower structure below the first surface of the substrate; a conductive pad disposed on the second surface of the substrate and disposed on the first area; an insulating protrusion pattern disposed on the second surface of the substrate, disposed on the second area, and having a step from the second surface of the substrate; an upper structure disposed on the second surface of the substrate and having a lower pad; a connection pattern disposed between the conductive pad and the lower pad, and in contact with the conductive pad and the lower pad; and an adhesive material layer including a portion filling a space between the conductive pad and the lower pad, surrounding a side surface of the connection pattern and extending to a side surface of the upper structure. The upper structure includes a semiconductor chip.

According to exemplary embodiments, a method of forming a semiconductor package includes forming a front structure on a front side of a semiconductor wafer; reducing a thickness of the semiconductor wafer; forming a rear structure including a rear protective layer, a rear protrusion pattern, and a rear alignment key on a back side of the semiconductor wafer having a reduced thickness; forming a rear pad on the rear protective layer of the back side of the semiconductor wafer; and separating semiconductor chips by cutting the semiconductor wafer. The rear protrusion pattern and the rear alignment key are simultaneously formed on the rear protective layer.

BRIEF DESCRIPTION OF DRAWINGS

The above and other aspects, features, and advantages of the present inventive concept will be more clearly understood from the following detailed description, taken in conjunction with the accompanying drawings, in which:

FIG. 6B is a plan view illustrating a modified example of a semiconductor package according to an exemplary embodiment;

DETAILED DESCRIPTION

Figure 1:
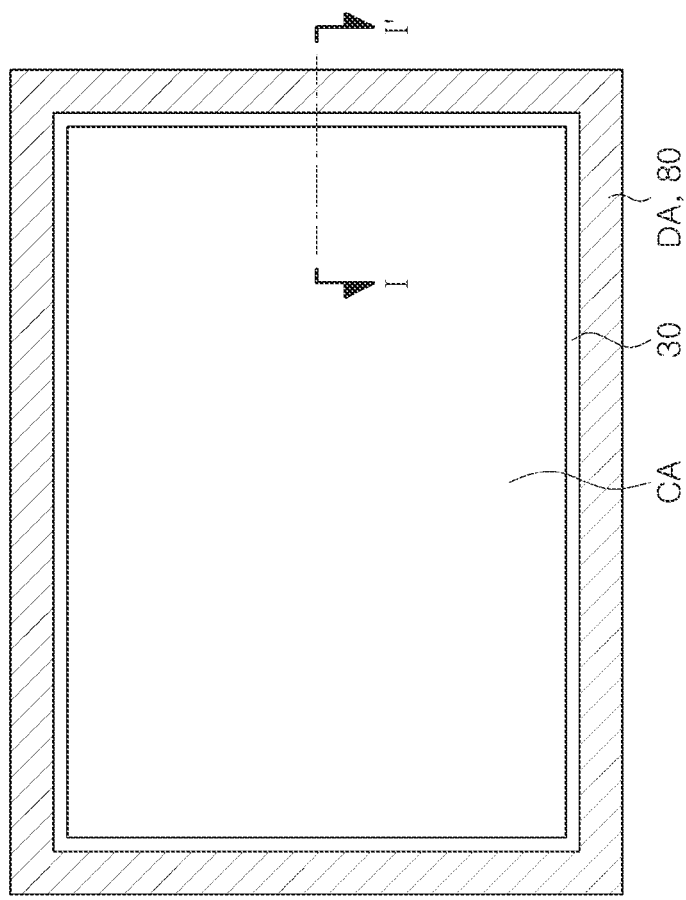
FIG. 1 is a plan view illustrating an example of a semiconductor package according to exemplary embodiments.

Hereinafter, terms used to distinguish the components of the semiconductor package from each other may be replaced with other terms with reference to the drawings. For example, terms such as "upper" and "lower" or terms such as "front" and "rear" may be replaced with other terms, for example, "first" and "second", or the like to be used to describe elements. Terms such as "first" and "second" may be used to describe various elements, but the elements are not limited by the terms, and "first element" may be referred to as "second element". In addition, terms such as 'top', 'upper portion', 'upper surface', 'bottom', 'lower portion', 'lower surface', and 'side surface' in the following can be understood as being referred based on the drawings, except in cases indicated by reference numerals and designated separately.

Figure 2:
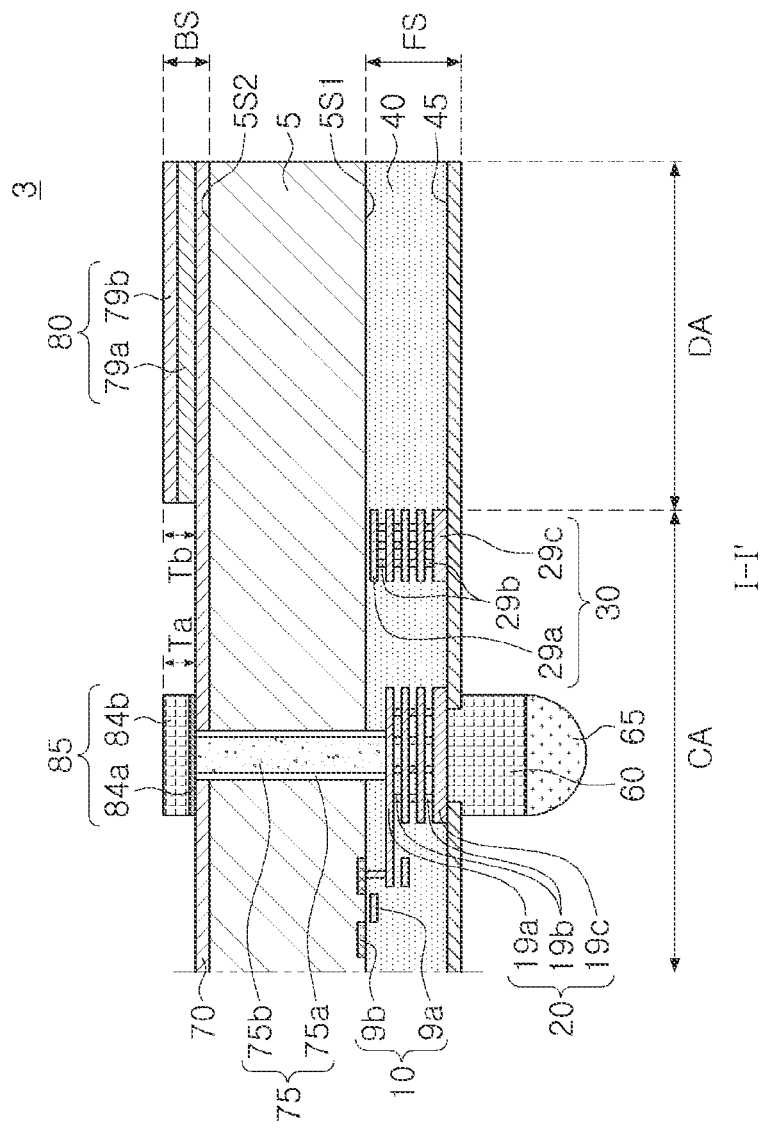
FIG. 2 is a cross-sectional view illustrating an example of a semiconductor package according to an exemplary embodiment.

FIG. 1 is a plan view illustrating an example of a semiconductor package according to an exemplary embodiment, and FIG. 2 is a cross-sectional view illustrating an example of a semiconductor package according to an exemplary embodiment. FIG. 2 is a cross-sectional view illustrating a partial region of FIG. 1, for example, a region taken along line I-I'.

Referring to FIGS. 1 and 2, a semiconductor package according to an exemplary embodiment may include a semiconductor chip 3. The semiconductor chip 3 has a front side 5S1 and a back side 5S2 opposing each other, and may include a semiconductor substrate 5 having a chip area CA and a dummy area DA surrounding the chip area CA.

The semiconductor substrate 5 may be a silicon substrate. However, exemplary embodiments are not limited thereto. For example, the semiconductor substrate 5 may include a group IV semiconductor formed of a material such as germanium or silicon-germanium, a group III-V compound semiconductor, or a group II-VI compound semiconductor.

The semiconductor chip 3 may further include a front structure FS below the front side 5S1 of the semiconductor substrate 5, and a rear structure BS on the back side 5S2 of the semiconductor substrate 5.

The front structure FS may include an internal circuit 10, a guard pattern 30, an internal connection pattern 20, and a front insulating structure 40, below the front side 5S1 of the semiconductor substrate 5.

The internal circuit 10 and the internal connection pattern 20 may be disposed below the chip area CA of the semiconductor substrate 5. The guard pattern 30 may be disposed below the chip area CA of the semiconductor substrate 5 adjacent to the dummy area DA.

The guard pattern 30 may include a first guard layer 29a, intermediate guard layers 29b below the first guard layer 29a, and a second guard layer 29c below the intermediate guard layers 29b. The intermediate guard layers 29b may include a plurality of layers positioned at different height levels, between the first guard layer 29a and the second guard layer 29c. The guard pattern 30 may be formed of a conductive material.

The guard pattern 30 may have a ring shape surrounding the internal circuit 10 and the internal connection pattern 20. The guard pattern 30 may serve to prevent moisture from entering from the side surface of the semiconductor chip 3 or to protect the chip area CA in the semiconductor chip 3 from cracks occurring during a sawing process for separating a plurality of semiconductor chips from a single semiconductor wafer.

The dummy area DA may serve to protect the chip area CA in the semiconductor chip 3 from cracks occurring during a sawing process for separating a plurality of semiconductor chips from one semiconductor wafer, together with the guard pattern 30.

The internal circuit 10 may include a semiconductor integrated circuit such as a transistor including a gate 9a and a source/drain 9b.

The internal connection pattern 20 may include a first connection layer 19a, intermediate connection layers 19b below the first connection layer 19a, and a second connection layer 19c below the intermediate insulating layers 19b. The intermediate insulating layers 19b may include a plurality of layers positioned at different height levels, between the first connection layer 19a and the second connection layer 19c. The internal connection pattern 20 may be formed of a conductive material.

At least a portion of the internal circuit 10 and at least a portion of the internal connection pattern 20 may be disposed in the front insulating structure 40. At least a portion of the internal circuit 10 and at least a portion of the internal connection pattern 20 may be buried in the front insulating structure 40.

The front structure FS may further include a front protective layer 45 below the front insulating structure 40. The front protective layer 45 may be formed of an insulating material.

The rear structure BS may be disposed on the back side 5S2 of the semiconductor substrate 5, to include a rear protective layer 70 overlapping the chip area CA and the dummy area DA and a rear protrusion pattern 80 disposed over the rear protective layer 70 and overlapping the dummy area DA.

As an example, the rear protective layer 70 may be formed as a single layer formed of silicon oxide. In another example, the rear protective layer 70 may be formed of multiple layers including different materials (e.g., silicon oxide and silicon nitride). In another example, the rear protective layer 70 may include a polymer material such as polyimide.

The back side 5S2 of the semiconductor substrate 5 may be substantially flat.

The rear protrusion pattern 80 may have a flat upper surface substantially parallel to the back side 5S2 of the semiconductor substrate 5.

As an example, the rear protrusion pattern 80 may be formed as a single layer. For example, the rear protrusion pattern 80 may include an insulating material such as silicon oxide or silicon nitride, or a polymer material such as polyimide.

In another example, the rear protrusion pattern 80 may include at least two insulating material layers 79a and 79b sequentially stacked. For example, the rear protrusion pattern 80 may include a first insulating material layer 79a and a second insulating material layer 79b sequentially stacked. From the at least two insulating material layers 79a and 79b of the rear protrusion pattern 80, the first insulating material layer 79a in contact with the rear protective layer 70 may include a material different from that of the rear protective layer 70 in contact with the rear protrusion pattern 80.

The first insulating material layer 79a and the second insulating material layer 79b may include different materials. For example, the first insulating material layer 79a may include silicon nitride, and the second insulating material layer 79b may include silicon oxide.

The semiconductor chip 3 may further include a through-electrode structure 75 that penetrates through the chip area CA of the semiconductor substrate 5 and the rear protective layer 70 and that is electrically connected to the internal connection pattern 20 of the front structure FS. The through-electrode structure 75 may include a through-electrode 75b and an insulating spacer 75a covering at least a side surface of the through-electrode 75b.

The semiconductor chip 3 may further include a front bump 60 penetrating through the front protective layer 45, electrically connected to the internal connection pattern 20 and extending to a lower portion of the front protective layer 45.

The semiconductor chip 3 may further include a connection pattern 65 electrically connected to the front bump 60 and disposed below the front bump 60. The connection pattern 65 may include a solder material.

The semiconductor chip 3 may further include a rear pad 85 electrically connected to the through-electrode structure 75, on the rear protective layer 70, and the through-electrode structure 75, and spaced apart from the rear protrusion pattern 80.

The rear pad 85 may include a first rear layer 84a and a second rear layer 84b on the first rear layer 84a.

As an example, the thickness of the semiconductor substrate 5 may be in a range of about 25 μm to about 100 μm.

As an example, a thickness Ta of the rear pad 85 may be in a range of about 2 μm to about 5 μm.

As an example, the thickness Ta of the rear pad 85 may be twice or more than the thickness of the rear protective layer 70.

As an example, the thickness of the rear structure BS may be about 4 μm or less. For example, the thickness of the rear structure BS may be about 3.15 μm.

As an example, the rear protective layer 70 may have a thickness of about 1 μm or less. For example, the rear protective layer 70 may have a thickness of about 0.6 μm.

As an example, a thickness Tb of the rear protrusion pattern 80 may be in a range of about 1 μm to about 4 μm. The rear protrusion pattern 80 may form a step difference of about 1 μm to about 4 μm with the rear protective layer 70.

As an example, in the rear protrusion pattern 80, the first insulating material layer 79a may be thicker than the second insulating material layer 79b. The first insulating material layer 79a of the rear protrusion pattern 80 may have a thickness of about 1.58 μm, and the second insulating material layer 79b may have a thickness of about 0.97 μm, but the exemplary embodiments thereof are not limited to the numerical values given above.

As an exemplary embodiment, the semiconductor chip 3 may be adhered to another component below the back side 5S2 of the semiconductor chip 3 by an adhesive material layer, thereby forming a semiconductor package. In such case, the rear protrusion pattern 80 may contact the adhesive material layer, and may serve to prevent the adhesive material layer from excessively protruding to the outside of the semiconductor chip 3 due to overflow. An example of the role of the rear protrusion pattern 80 will be described again with reference to FIGS. 8A and 8B.

Figure 3A:
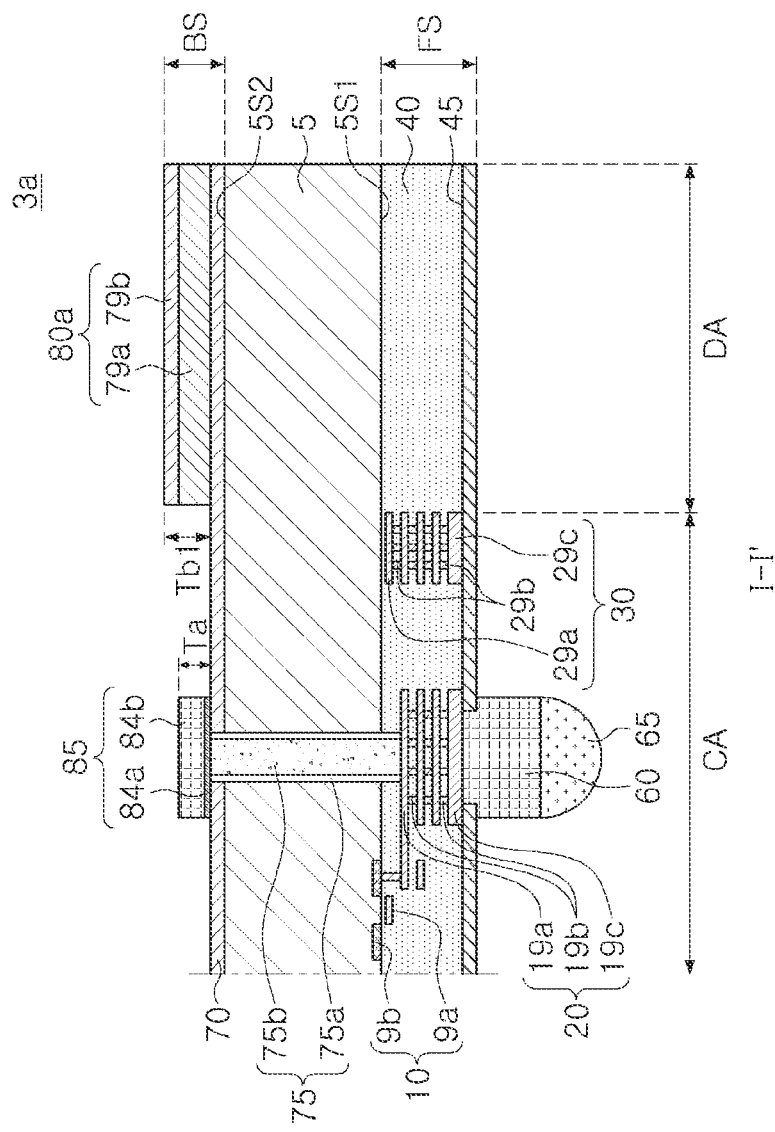
FIG. 3A is a cross-sectional view illustrating a modified example of a semiconductor package according to an exemplary embodiment.
Figure 3B:
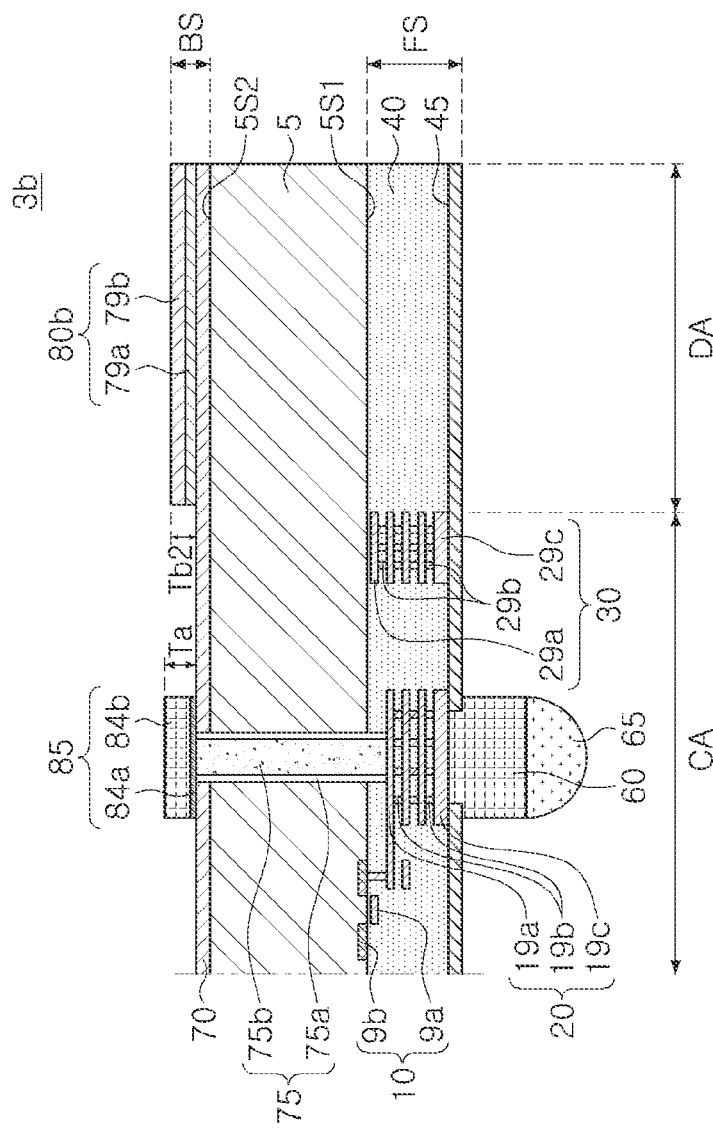
FIG. 3B is a cross-sectional view illustrating a modified example of a semiconductor package according to an exemplary embodiment.

In FIG. 2, the thickness Ta of the rear pad 85 is illustrated to be substantially the same as the thickness Tb of the rear protrusion pattern 80, but the exemplary embodiment is not limited thereto. Hereinafter, modified examples of the thickness Ta of the rear pad 85 and the thickness Tb of the rear protrusion pattern 80 of FIG. 2 will be described with reference to FIGS. 3A and 3B, respectively. FIGS. 3A and 3B are cross-sectional views illustrating modifications of the thickness Ta of the rear pad 85 and the thickness Tb of the rear protrusion pattern 80 in the cross-sectional view of FIG. 2, respectively.

In a modified example, referring to FIG. 3A, a semiconductor chip 3b may include a rear protrusion pattern 80a having a thickness Tb greater than the thickness Ta1 of the rear pad 85. For example, the rear protrusion pattern 80 of FIG. 2 may be replaced with the rear protrusion pattern 80a of FIG. 3A.

In a modified example, referring to FIG. 3B, a semiconductor chip 3c may include a rear protrusion pattern 80b having a thickness Tb2 greater than the thickness Ta of the rear pad 85. For example, the rear protrusion pattern 80 of FIG. 2 may be replaced with the rear protrusion pattern 80b of FIG. 3B.

Figure 4A:
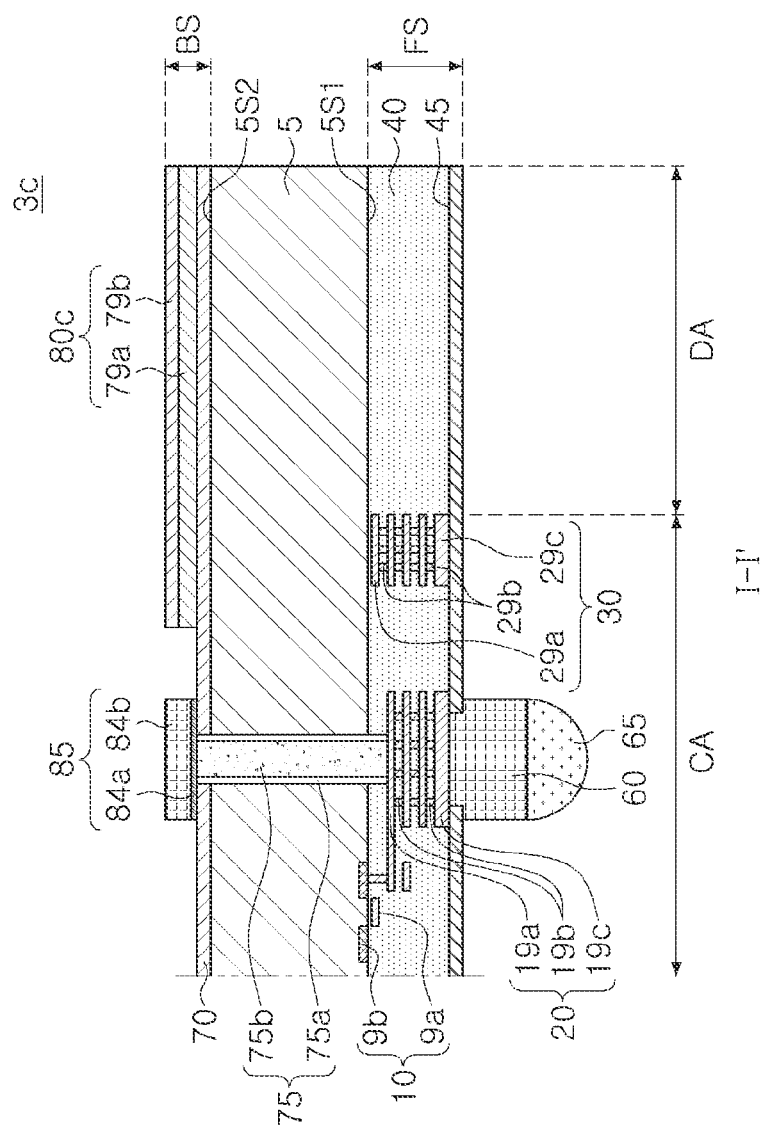
FIG. 4A is a cross-sectional view illustrating a modified example of a semiconductor package according to an exemplary embodiment.
Figure 4B:
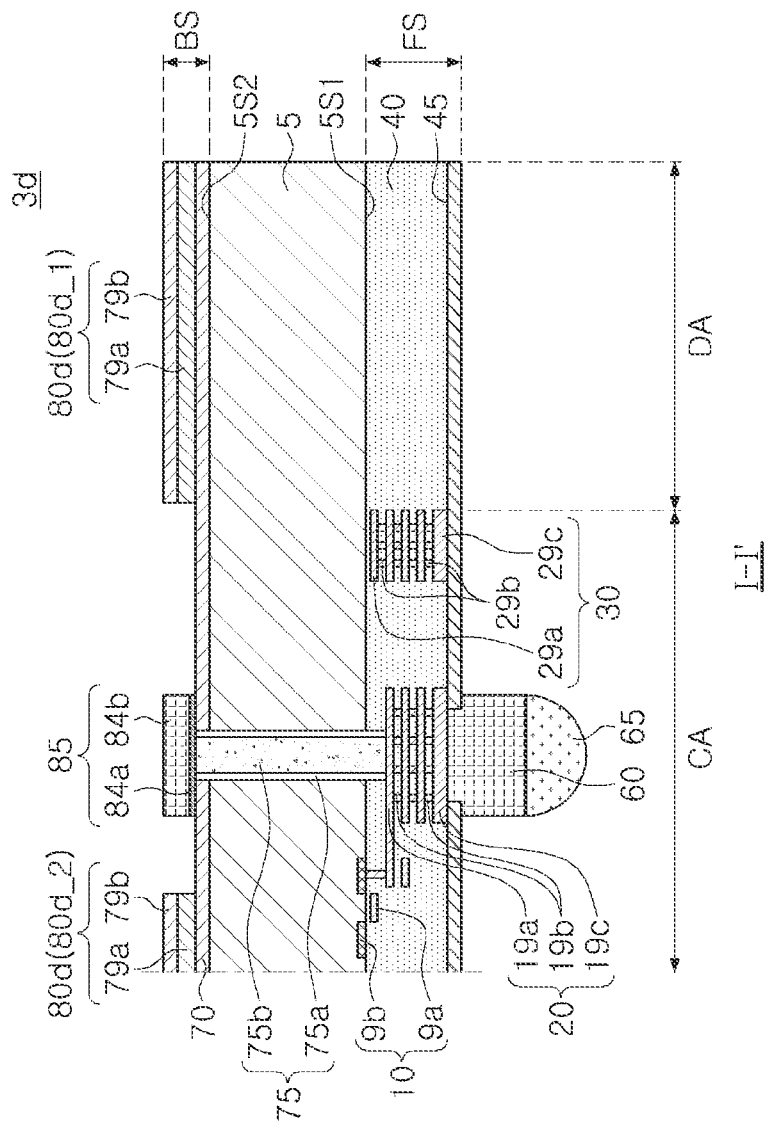
FIG. 4B is a cross-sectional view illustrating a modified example of a semiconductor package according to an exemplary embodiment.

Next, with reference to FIGS. 4A and 4B, respectively, modifications of the rear protrusion pattern 80 described with reference to FIG. 2 will be described. FIGS. 4A and 4B are cross-sectional views respectively illustrating modifications of the rear protrusion pattern 80 illustrated in the cross-sectional view of FIG. 2.

In a modified example, referring to FIG. 4A, a semiconductor chip 3d may include a rear protrusion pattern 80c that may replace the rear protrusion pattern 80 of FIG. 2. The rear protrusion pattern 80c may extend from a portion positioned in the dummy area DA onto the chip area CA to vertically overlap the guard pattern 30.

In a modified example, referring to FIG. 4B, the semiconductor chip 3d may include a rear protrusion pattern 80d that may replace the rear protrusion pattern 80 of FIG. 2. The rear protrusion pattern 80d may include a first portion 80d_1 positioned on the dummy area DA, and a second portion 80d_2 vertically overlapping a portion of the internal circuit 10 in the chip area CA.

Figure 5:
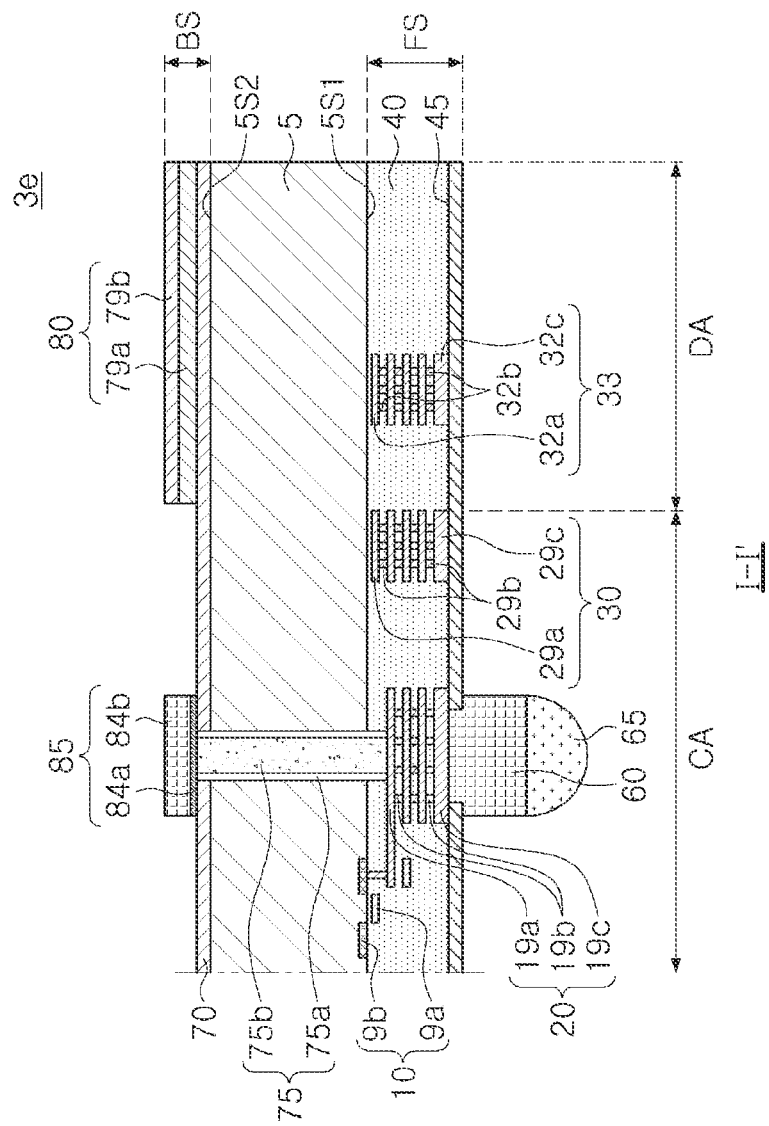
FIG. 5 is a cross-sectional view illustrating a modified example of a semiconductor package according to an exemplary embodiment.

Next, a modified example of the semiconductor chip 3 described with reference to FIG. 2 will be described with reference to FIG. 5. FIG. 5 is a cross-sectional view illustrating a modified example of the semiconductor chip 3 described in FIG. 2.

In a modified example, referring to FIG. 5, a semiconductor chip 3e may include a front structure FS further including chipping dams 33. For example, the semiconductor chip 3e may further include the chipping dams 33 as compared to the semiconductor chip 3 of FIG. 2.

The chipping dams 33 may be disposed in the front insulating structure 40, below the dummy area DA of the semiconductor substrate 5.

The chipping dams 33 may be disposed spaced apart from each other on the outside of a ring-shaped guard pattern 30.

The dummy area DA and the chipping dams 33 may serve to protect the chip area CA in the semiconductor chip 3 from cracks occurring during a sawing process for separating a plurality of semiconductor chips from one semiconductor wafer.

The chipping dams 33 may include a first dam layer 32a, intermediate dam layers 32b below the first dam layer 32a, and a second dam layer 32c below the intermediate dam layers 32b. The intermediate dam layers 32b may include a plurality of layers positioned at different height levels between the first dam layer 32a and the second dam layer 32c. The chipping dams 33 may be formed of a conductive material.

Figure 6A:
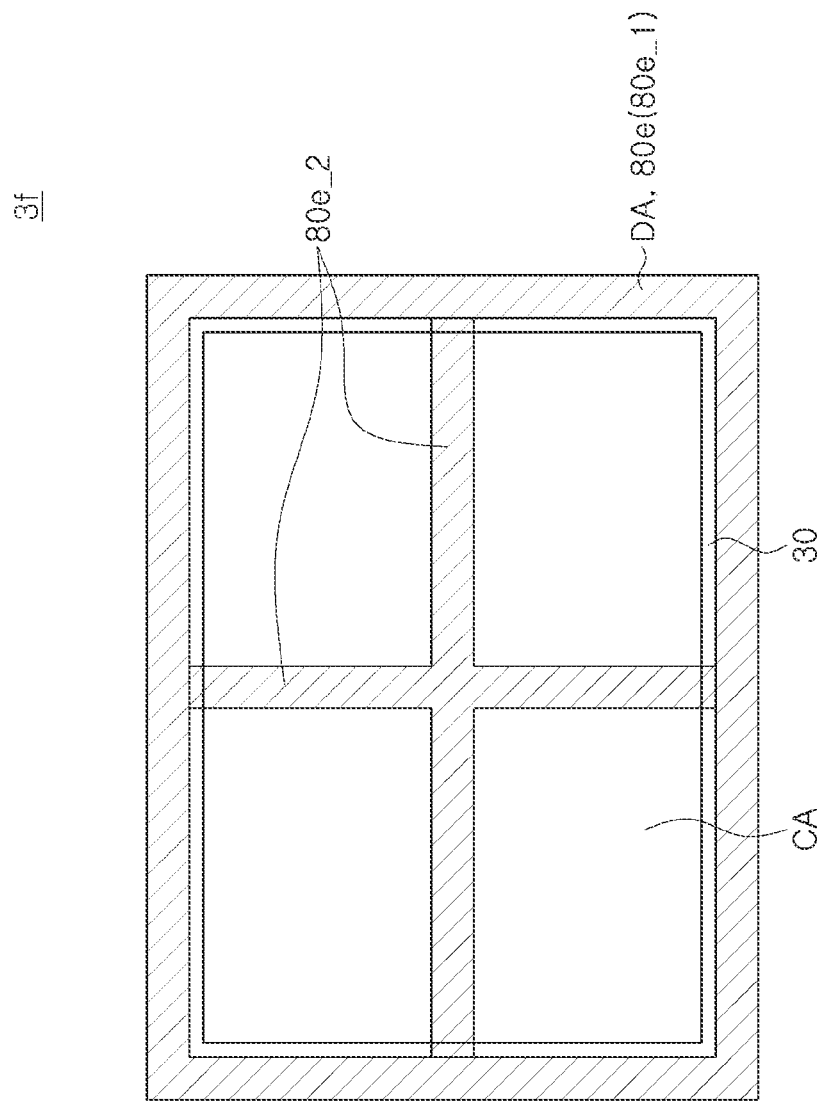
FIG. 6A is a plan view illustrating a modified example of a semiconductor package according to an exemplary embodiment.

Next, modified examples of the rear protrusion pattern 80 described in FIG. 1 will be described with reference to FIGS. 6A and 6B, respectively. FIGS. 6A and 6B are plan views illustrating modifications of the rear protrusion pattern 80 described above referring to the plan view of FIG. 1, respectively.

In a modified example, referring to FIG. 6A, the semiconductor chip 3e example may include a rear protrusion pattern 80e that may replace the rear protrusion pattern 80 in FIG. 1. The rear protrusion pattern 80e may include a first portion 80e_1 overlapping the dummy area DA, and a second portion 80e_2 overlapping the chip area CA.

The first portion 80e_1 may have a ring shape. The second portion 80e_2 may extend from the first portion 80e_1.

In an exemplary embodiment, the second portion 80e_2 is not limited to the shape illustrated in FIG. 6A. For example, the second portion 80e_2 may be formed to be spaced apart from the first portion 80e_1.

In a modified example, referring to FIG. 6B, a semiconductor chip 3g may include a rear protrusion pattern 80f that may replace the rear protrusion pattern 80 in FIG. 1.

The rear protrusion pattern 80f may include a plurality of first portions 80f_1 overlapping the dummy area DA and spaced apart from each other. In the dummy area DA, the rear protective layer 70, not covered by the first portions 80f_1, may be exposed.

The rear protrusion pattern 80f may further include a second portion 80e_2 overlapping the chip area CA. The second portion 80f_2 may extend from the first portions 80f_1, but exemplary embodiments are not limited thereto. For example, the second portion 80f_2 may be formed to be spaced apart from at least one of the first portions 80f_1.

Figure 7:
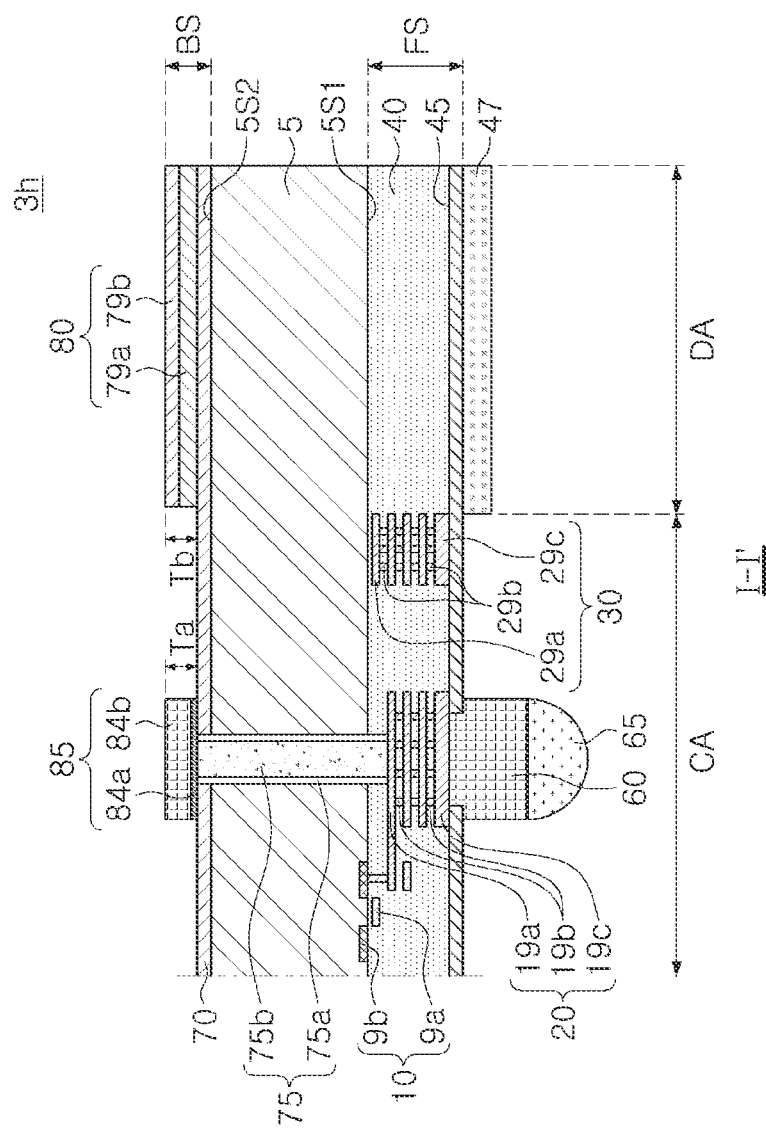
FIG. 7 is a cross-sectional view illustrating a modified example of a semiconductor package according to an exemplary embodiment.

Next, a modified example of the semiconductor chip 3 described with reference to FIG. 2 will be described with reference to FIG. 7. FIG. 7 is a cross-sectional view illustrating a modified example of the semiconductor chip 3 described in FIG. 2.

In a modified example, referring to FIG. 7, a semiconductor chip 3h may include a front structure FS further including a front protrusion pattern 47. For example, the semiconductor chip 3h may further include a front protrusion pattern 47 compared to the semiconductor chip 3 of FIG. 2.

The front protrusion pattern 47 may contact the front protective layer 45, below the front protective layer 45. The front protrusion pattern 47 may vertically overlap the dummy area DA of the semiconductor substrate 5. At least a portion of the front protrusion pattern 47 may vertically overlap at least a portion of the rear protrusion pattern 80.

The front protrusion pattern 47 may be formed of an insulating material. The front protrusion pattern 47 may be formed as a single layer or in multiple layers.

In an exemplary embodiment, the semiconductor chip 3 may be adhered to another component below the front side 5S1 of the semiconductor chip 3 by an adhesive material layer, thereby constituting a semiconductor package. In this case, the front protrusion pattern 47 may contact the adhesive material layer, and may serve to prevent the adhesive material layer from excessively protruding out of the semiconductor chip 3. An example of the role of the front protrusion pattern 47 will be described again with reference to FIGS. 10A and 10B.

Figure 8A:
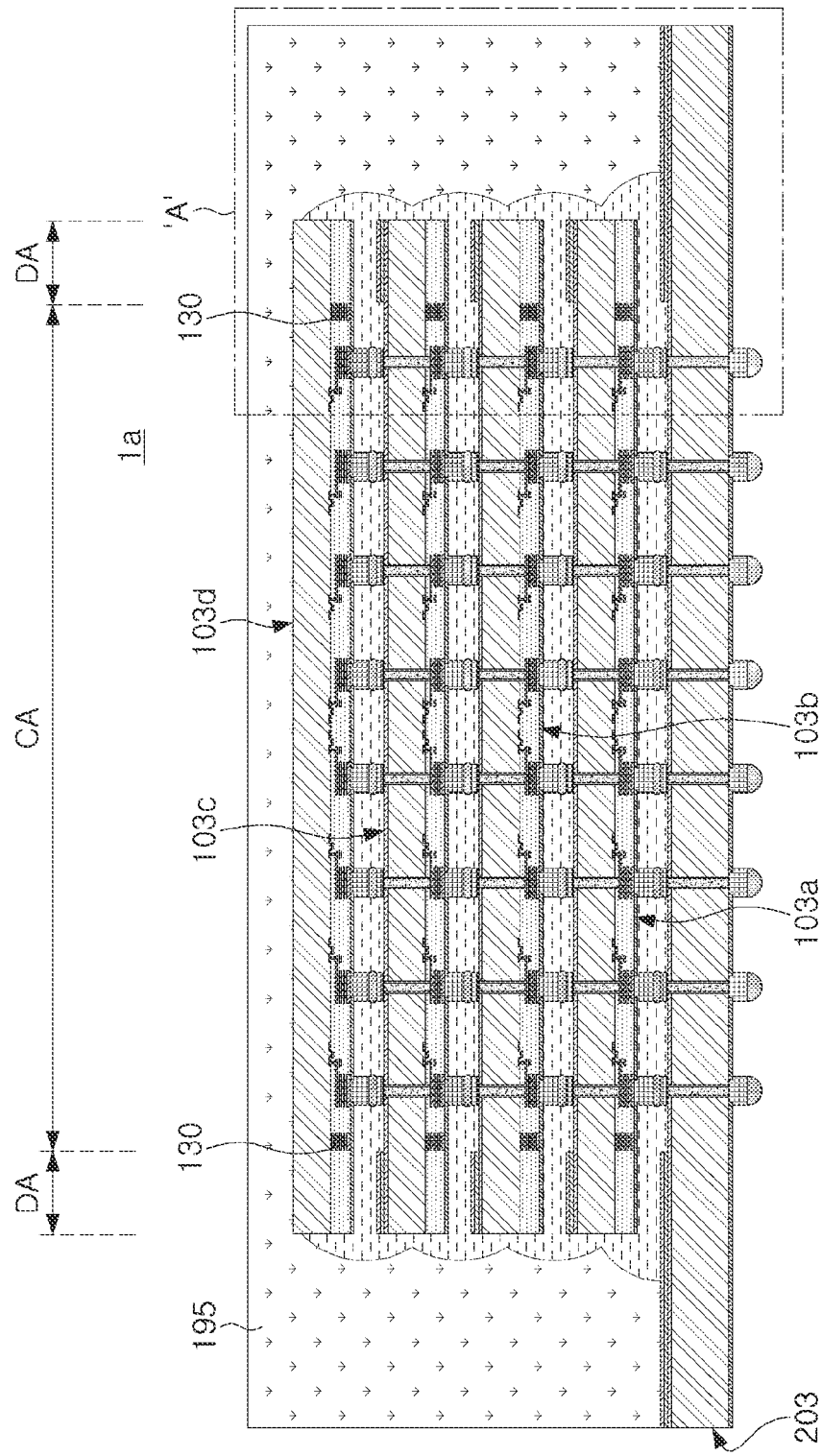
FIGS. 8A and 8B are diagrams illustrating an example of a semiconductor package according to an exemplary embodiment.

Next, an example of a semiconductor package according to an exemplary embodiment will be described with reference to FIGS. 8A and 8B. FIG. 8A is a cross-sectional view illustrating an example of a semiconductor package according to an exemplary embodiment, and FIG. 8B is a partially enlarged view of an area indicated by 'A' of FIG. 8A.

Figure 8B:
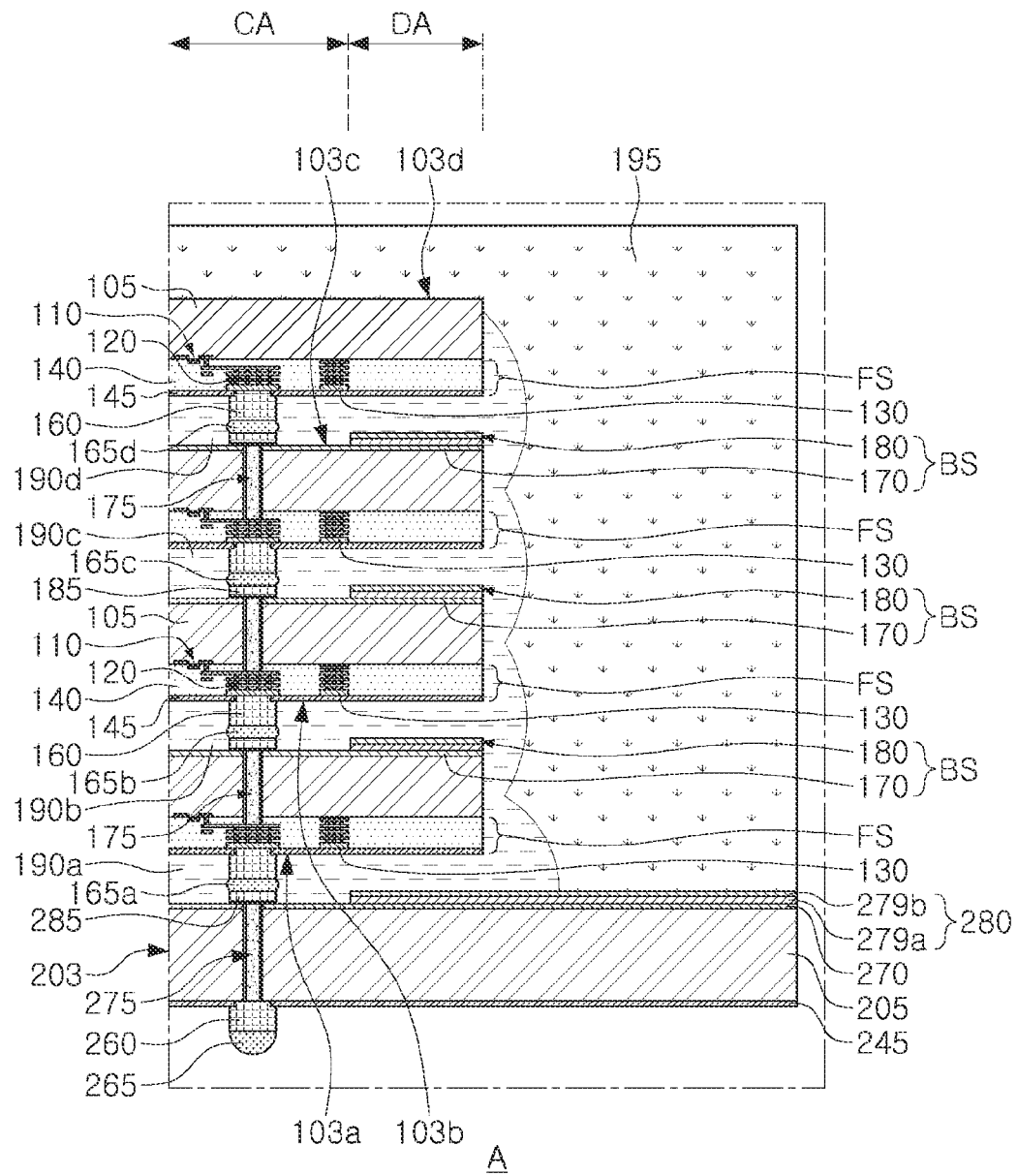

Referring to FIGS. 8A and 8B, a semiconductor package 1a according to an exemplary embodiment may include a base 203, a plurality of semiconductor chips 103a, 103b, 103c and 103d, connection patterns 165a, 165b, 165c and 165d, adhesive material layers 190a, 190b, 190c and 190d, and a mold layer 195.

The plurality of semiconductor chips 103a, 103b, 103c, and 103d may be vertically stacked on the base 203.

The plurality of semiconductor chips 103a, 103b, 103c, and 103d are illustrated as including four semiconductor chips, but exemplary embodiments are not limited thereto. For example, the plurality of semiconductor chips may include fewer than four semiconductor chips or may include more than four semiconductor chips.

Although the plurality of semiconductor chips 103a, 103b, 103c, and 103d are illustrated as having the same shape, exemplary embodiments are not limited thereto. For example, the plurality of semiconductor chips 103a, 103b, 103c, and 103d may include different types of semiconductor chips or semiconductor chips having different shapes.

The plurality of semiconductor chips 103a, 103b, 103c, and 103d may include a first semiconductor chip 103a, a second semiconductor chip 103b, a third semiconductor chip 103c, and a fourth semiconductor chip 103d that are sequentially stacked.

The connection patterns 165a, 165b, 165c, and 165d may include a first connection pattern 165a electrically connecting the first semiconductor chip 103a and the base 203, between the first semiconductor chip 103a and the base 203, a second connection pattern 165b electrically connecting the first semiconductor chip 103a and the second semiconductor chip 103b, between the first semiconductor chip 103a and the second semiconductor chip 103b, a third connection pattern 165c electrically connecting the second semiconductor chip 103b and the third semiconductor chip 103c, between the second semiconductor chip 103b and the third semiconductor chip 103c, and a fourth connection pattern 165d electrically connecting the third semiconductor chip 103c and the fourth semiconductor chip 103c, between the third semiconductor chip 103c and the fourth semiconductor chip 103d. The connection patterns 165a, 165b, 165c, and 165d may include a solder material.

The adhesive material layers 190a, 190b, 190c and 190d may include a first adhesive material layer 190a filling between the first semiconductor chip 103a and the base 203 and surrounding a side surface of the first connection pattern 165a, a second adhesive material layer 190b filling between the first semiconductor chip 103a and the second semiconductor chip 103b and surrounding a side surface of the second connection pattern 165b, a third adhesive material layer 190c filling between the second semiconductor chip 103b and the third semiconductor chip 103c and surrounding a side surface of the third connection pattern 165c, and a fourth adhesive material layer 190d filling between the third semiconductor chip 103c and the fourth semiconductor chip 103c and surrounding a side surface of the fourth connection pattern 165d.

The adhesive material layers 190a, 190b, 190c, and 190d may cover side surfaces of the plurality of semiconductor chips 103a, 103b, 103c, and 103d, and may be connected to each other on the side surfaces of the plurality of semiconductor chips 103a, 103b, 103c, and 103d.

The adhesive material layers 190a, 190b, 190c, and 190d may be non-conductive material layers formed of an epoxy-based material. For example, the adhesive material layers 190a, 190b, 190c, and 190d may be a non-conductive film (NCF), however, this exemplary embodiment is not limited thereto.

At least one of the plurality of semiconductor chips 103a, 103b, 103c, and 103d may have a structure substantially the same as or similar to that of the semiconductor chip 3 described with reference to FIGS. 1 and 2. For example, each of the first to fourth semiconductor chips 103a, 103b, 103c, and 103d may include the front structure FS described with reference to FIGS. 1 and 2. For example, in each of the first to third semiconductor chips 103a, 103b, and 103c, the front structure FS may include an internal circuit 110, a guard pattern 130, an internal connection pattern 120, a front insulating structure 140, and a front protective layer 145 corresponding to the internal circuit 10, the guard pattern 30, the internal connection pattern 20, the front insulating structure 40, and the front protective layer 45 described with reference to FIG. 2, respectively.

Each of the first to third semiconductor chips 103a, 103b, and 103c may further include the front structure FS and the rear structure BS described with reference to FIGS. 1 and 2. The rear structure BS may include a rear protective layer 170 and a rear protrusion pattern 180 corresponding to the rear protective layer 70 and the rear protrusion pattern 80 described with reference to FIG. 2, respectively.

Each of the first to fourth semiconductor chips 103a, 103b, 103c and 103d may further include a semiconductor substrate 105, a front protective layer 170, and a front bump 160 corresponding to the semiconductor substrate 5, the front protective layer 70 and the front bump 60 described with reference to FIGS. 1 and 2, respectively.

Each of the first to third semiconductor chips 103a, 103b, and 103c may further include a through-electrode structure 175 and a rear pad 185 corresponding to the through-electrode structure 75 and the rear pad 85 described with reference to FIGS. 1 and 2, respectively.

In some exemplary embodiments, each of the plurality of semiconductor chips 103a, 103b, 103c, and 103d may include a chip area CA and a dummy area DA similarly to those described with reference to FIGS. 1 and 2.

In exemplary embodiments, to distinguish the components of the first to fourth semiconductor chips 103a, 103b, 103c, and 103d from each other, the components of the first semiconductor chip 103a may be described as first components. In addition, components of the second semiconductor chip 103b may be described as second components, and components of the third semiconductor chip 103c may be described as third components. For example, in the first semiconductor chip 103a, the front structure FS, the rear structure BS, the semiconductor substrate 105, the through-electrode structure 175, the front protective layer 170, the front bump 160 and the rear pad 185 may be referred to and described as a first front structure FS, a first rear structure BS, a first semiconductor substrate 105, a first through-electrode structure 175, a first front protective layer 170, a first front bump 160, and a first rear pad 185, respectively, and in the second semiconductor chip 103b, the front structure FS, the rear structure BS, the semiconductor substrate 105, the through-electrode structure 175, the front protective layer 170, the front bump 160, and the rear pad 185 may be referred to as and described as a second front structure FS, a second rear structure BS, a second semiconductor substrate 105, a second through-electrode structure 175, a second front protective layer 170, a second front bump 160, and a second rear pad 185, respectively.

In an exemplary embodiment, due to the rear protrusion pattern 180 of the first semiconductor chip 103a having a stepped and protruding shape, the space between the chip area CA of the first semiconductor chip 103a and the chip area CA of the second semiconductor chip 103b may be sufficiently secured, and the second adhesive material layer 190b filling the secured space between the chip area CA of the first semiconductor chip 103a and the chip area CA of the second semiconductor chip 103b may be stably and reliably formed without excessively protruding to out of the first and second semiconductor chips 103a and 103b. The rear protrusion patterns 180 of the second and third semiconductor chips 103b and 103c and the upper protrusion pattern 280 of the base 203 may serve substantially the same function as the rear protrusion pattern 180 of the first semiconductor chip 103a. Accordingly, the rear protrusion patterns 180 of the first to third semiconductor chips 103a, 103b and 103c may prevent the second to fourth adhesive material layers 190b, 190c and 190d from excessively protruding out of the first to fourth semiconductor chips 103a, 103b, 103c and 103d due to overflow. In addition, the upper protrusion pattern 280 of the base 203 may prevent the first adhesive material layer 190a from excessively protruding out of the first semiconductor chip 103a due to overflow. In addition, due to the rear protrusion patterns 180 of the first to third semiconductor chips 103a, 103b and 103c and the upper protrusion pattern 280 of the base 203, the adhesive material layers 190a, 190b, 190c, and 190d may be formed stably and reliably.

The base 203 may be a buffer semiconductor chip or a logic semiconductor chip. The base 203 may have a greater width or a larger size than each of the plurality of semiconductor chips 103a, 103b, 103c, and 103d.

The base 203 may include a chip body 205, a lower protective layer 245 disposed on a lower surface of the chip body 205, an upper protective layer 270 disposed on an upper surface of the chip body 205, an upper protrusion pattern 280 vertically overlapping the rear protrusion pattern 180, on the upper protective layer 270 and extending to a region not overlapping the plurality of semiconductor chips 103a, 103b, 103c, and 103d.

The upper protrusion pattern 280 may include a first layer 279a and a second layer 279b that are sequentially stacked. However, the exemplary embodiment is not limited thereto. For example, the upper protrusion pattern 280 may be formed as a single layer. The upper protrusion pattern 280 may be formed of an insulating material.

The base 203 may further include a through-electrode structure 275 penetrating through at least a portion of the chip body 205 and the upper protective layer 270, an upper pad 285 electrically connected to the through-electrode structure 275, on the upper protective layer 270, and a lower bump 260 penetrating through the lower protective layer 245, extending downwardly of the lower protective layer 245 and electrically connected to the through-electrode structure 275.

The semiconductor package 1a may further include a lower connection pattern 265 contacting the lower bump 260, below the base 203.

In exemplary embodiments, the rear protrusion pattern 180 may be replaced with rear protrusion patterns (80a in FIG. 3A, 80b in FIG. 3B, 80c in FIG. 4A, 80d in FIG. 4B, 80e in FIG. 6A, 80f in FIG. 6B).

At least one of the plurality of semiconductor chips 103a, 103b, 103c, and 103d may be a memory semiconductor chip such as a DRAM, or a memory semiconductor chip such as a NAND flash. The types of the plurality of semiconductor chips 103a, 103b, 103c, and 103d are not limited to the aforementioned DRAM or NAND flash. For example, at least one of the plurality of semiconductor chips 103a, 103b, 103c, and 103d may be a PRAM, a resistive change memory (ReRAM), or a magnetoresistive memory (MRAM).

The plurality of semiconductor chips 103a, 103b, 103c, and 103d may be semiconductor chips of the same type, for example, a memory semiconductor chip such as a DRAM.

The plurality of semiconductor chips 103a, 103b, 103c, and 103d may include different types of semiconductor chips. For example, any one of the plurality of semiconductor chips 103a, 103b, 103c, and 103d may be a logic semiconductor chip or a processor chip, and one or a plurality of the other chips may be a memory semiconductor chip. For example, the plurality of semiconductor chips 103a, 103b, 103c, and 103d may include a chip that may be a logic semiconductor chip or a processor chip, and one or a plurality of memory semiconductor chips that are disposed on the lower chip.

Figure 9A:
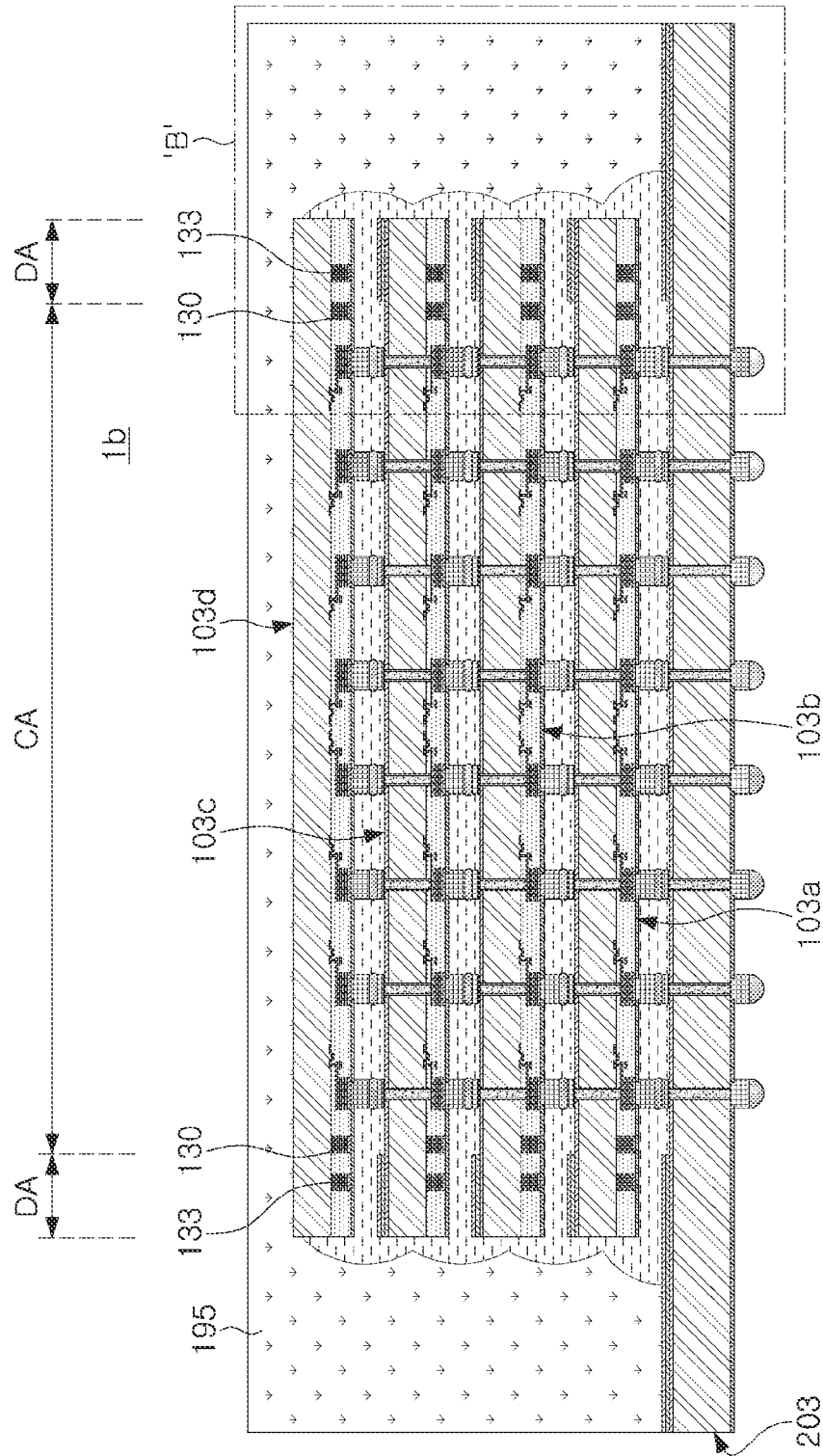
FIGS. 9A and 9B are views illustrating a modified example of a semiconductor package according to an exemplary embodiment.

Next, a modified example of the semiconductor package according to an exemplary embodiment will be described with reference to FIGS. 9A and 9B. FIG. 9A is a cross-sectional view illustrating a modified example of a semiconductor package according to an exemplary embodiment, and FIG. 9B is a partially enlarged view of an area indicated by 'B' in FIG. 9A.

Figure 9B:
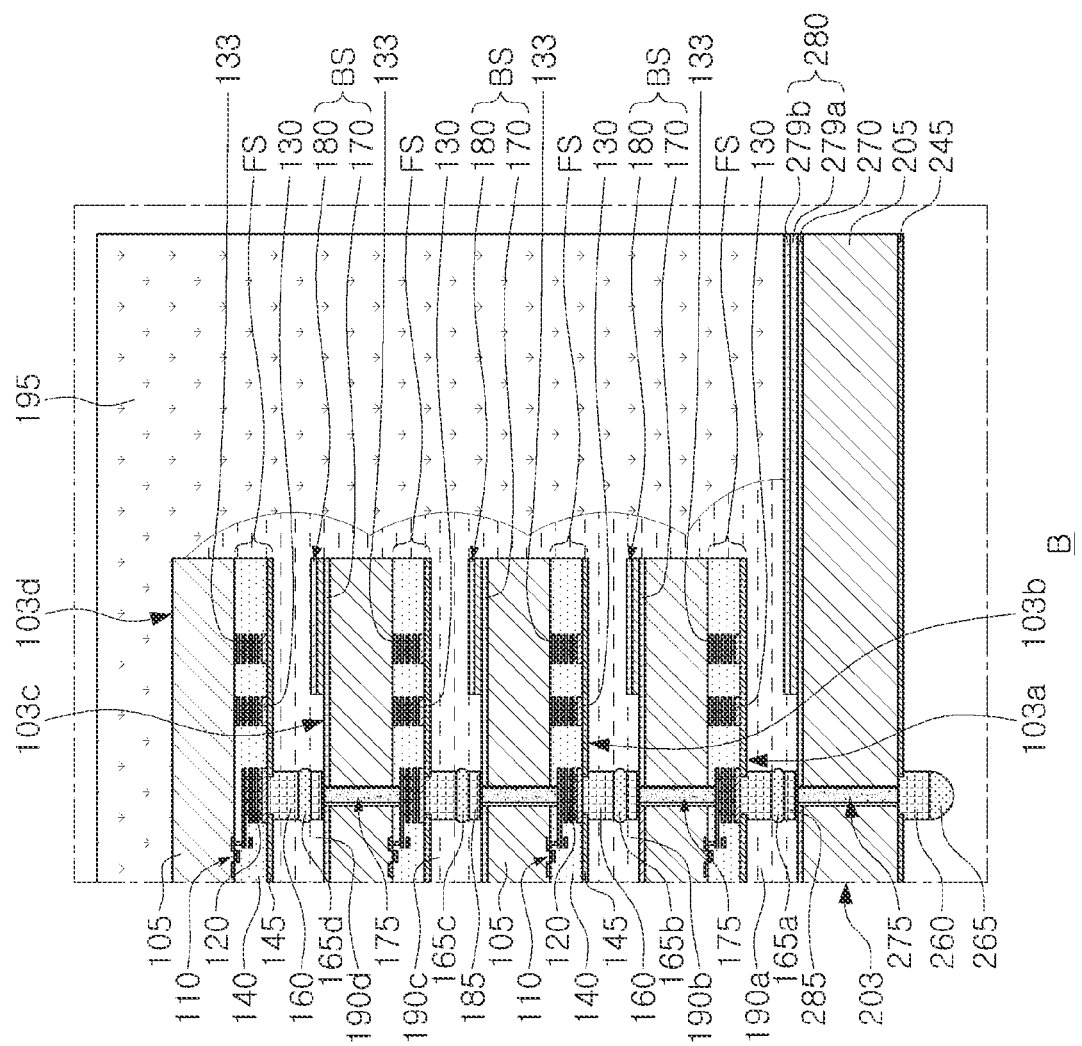

In a modified example, referring to FIGS. 9A and 9B, a semiconductor package 1b may further include chipping dams 133 as compared to the semiconductor package 1a described in FIGS. 8A and 8B. For example, in the semiconductor package 1b, the chipping dams 133 may be disposed in the front insulating structure 140 of each of the plurality of semiconductor chips 103a, 103b, 103c, and 103d described with reference to FIGS. 8A and 8B. The chipping dams 133 disposed in each of the plurality of semiconductor chips 103a, 103b, 103c, and 103d may be substantially the same as the chipping dams 33 described with reference to FIG. 5.

Figure 10A:
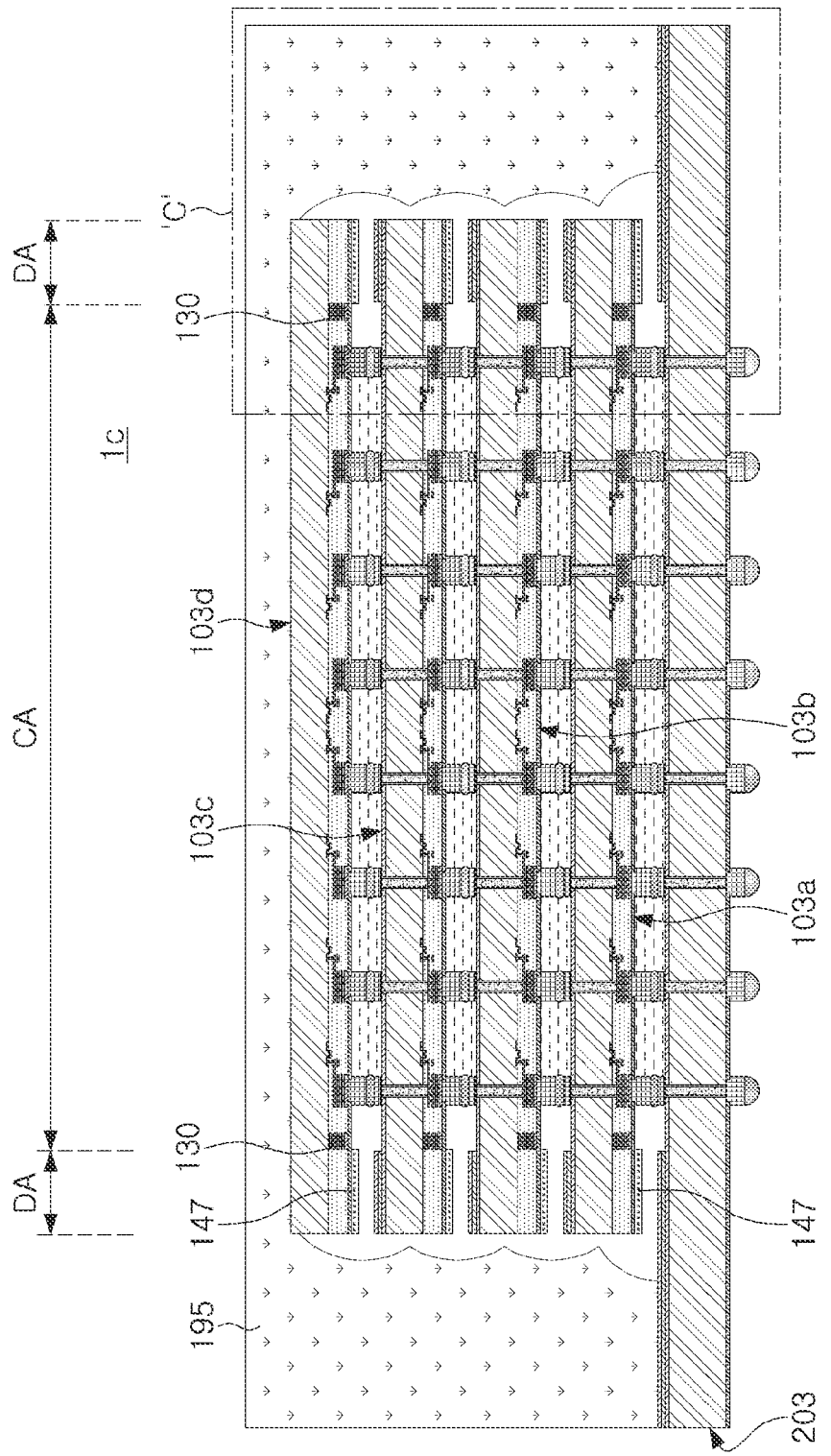
FIGS. 10A and 10B are views illustrating a modified example of a semiconductor package according to an exemplary embodiment.

Next, a modified example of the semiconductor package according to an exemplary embodiment will be described with reference to FIGS. 10A and 10B. FIG. 10A is a cross-sectional view illustrating a modified example of a semiconductor package according to an exemplary embodiment, and FIG. 10B is a partially enlarged view of an area indicated by 'C' in FIG. 10A.

Figure 10B:
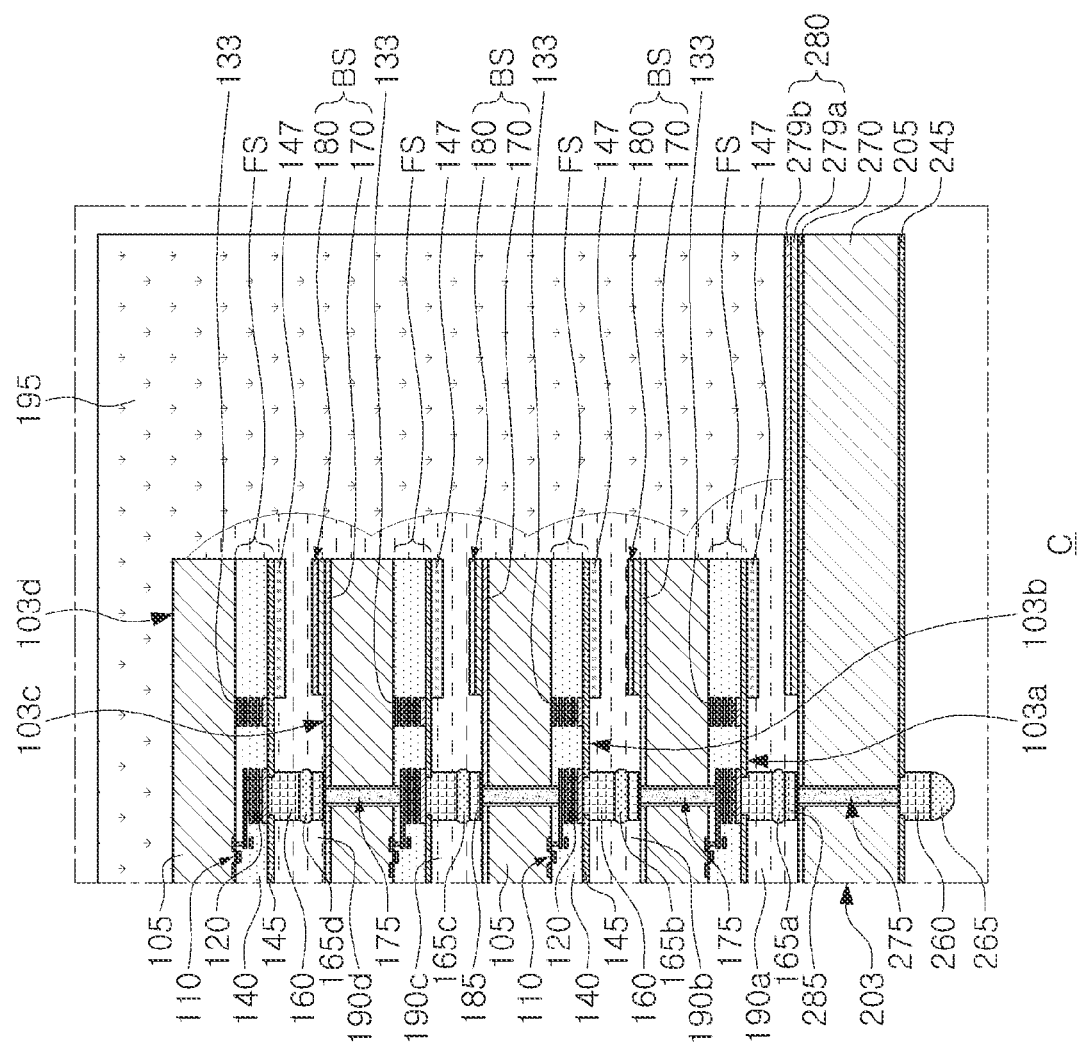

In a modified example, referring to FIGS. 10A and 10B, a semiconductor package 1c in the modified example may further include a front protrusion pattern 147 as compared to the semiconductor package 1a described in FIGS. 8A and 8B. For example, in the semiconductor package 1c, the front protrusion pattern 147 may be disposed below the front protective layer 145 of each of the plurality of semiconductor chips 103a, 103b, 103c, and 103d described with reference to FIGS. 8A and 8B. The front protrusion pattern 147 disposed in each of the plurality of semiconductor chips 103a, 103b, 103c, and 103d may be substantially the same as the front protrusion pattern 47 described with reference to FIG. 7.

In an exemplary embodiment, the front protrusion pattern 147 disposed in each of the plurality of semiconductor chips 103a, 103b, 103c, and 103d and having a stepped and protruding shape may perform substantially the same function as the rear protrusion patterns 180 described with reference to FIGS. 8A and 8B. For example, the front protrusion pattern 147 disposed in each of the plurality of semiconductor chips 103a, 103b, 103c, and 103d may prevent the first to fourth adhesive material layers 190a, 190b, 190c, and 190d from excessively protruding out of the first to fourth semiconductor chips 103a, 103b, 103c, and 103d.

Figure 11A:
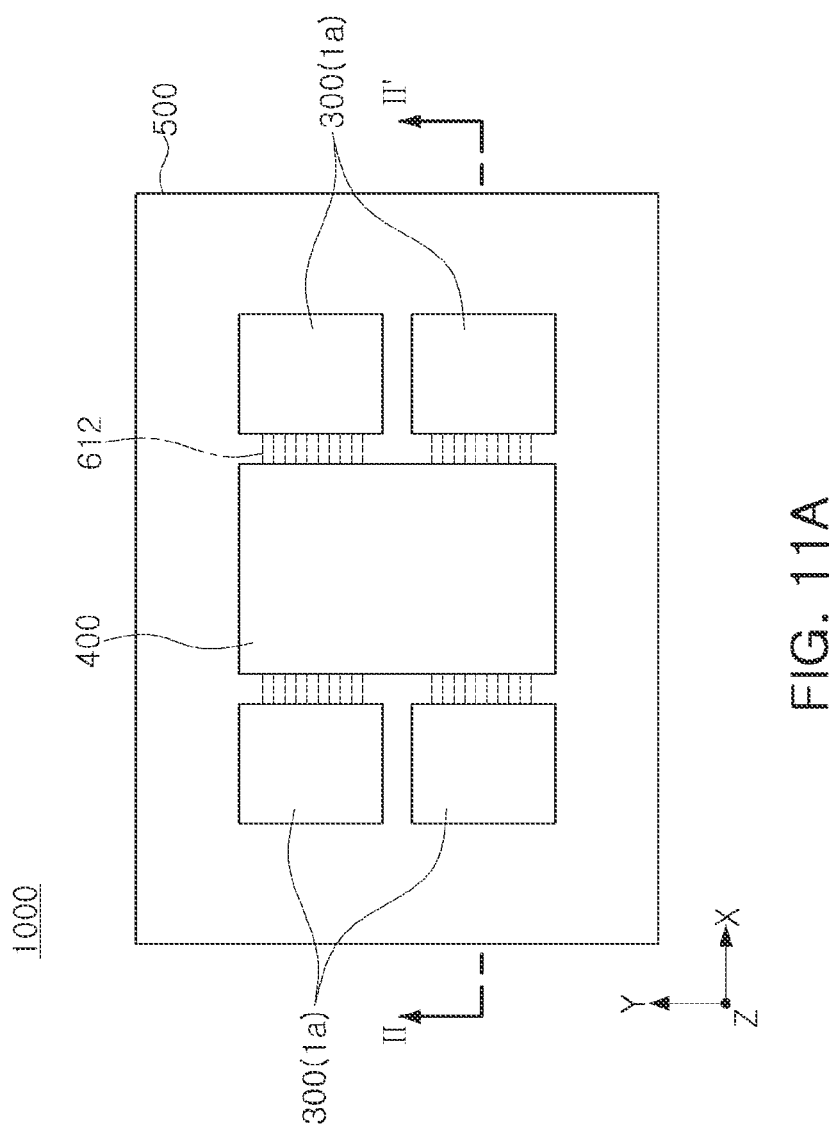
FIGS. 11A, 11B, and 11C are diagrams illustrating another example of a semiconductor package according to an exemplary embodiment.

Next, an example of a semiconductor package according to an exemplary embodiment will be described with reference to FIGS. 11A to 11C. FIG. 11A is a plan view illustrating an example of a semiconductor package according to an exemplary embodiment, FIG. 11B is a cross-sectional view taken along line II-II' of FIG. 11A, and FIG. 11C is a cross-sectional view illustrating partial configurations of FIG. 11B.

Figure 11B:
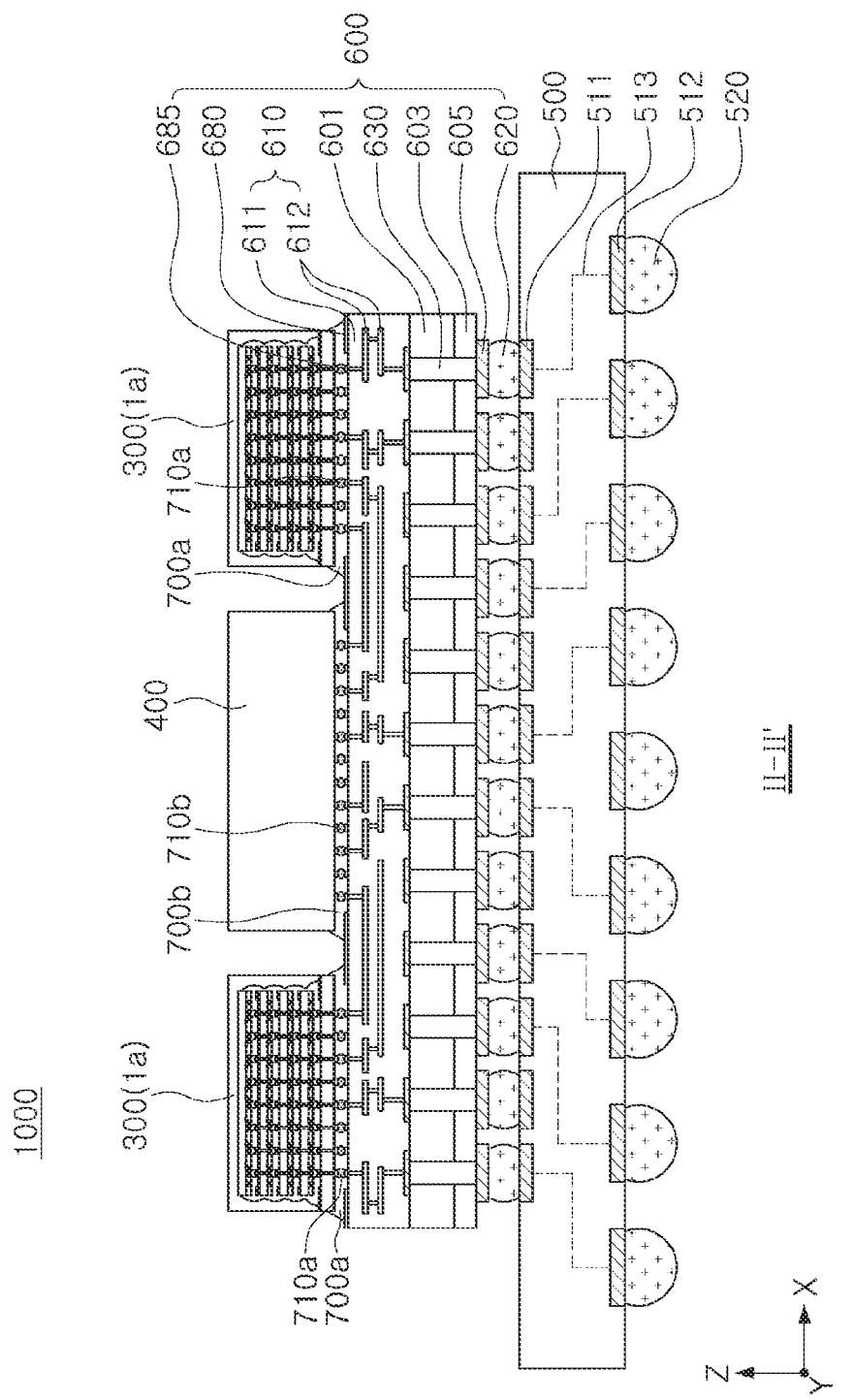
Figure 11C:
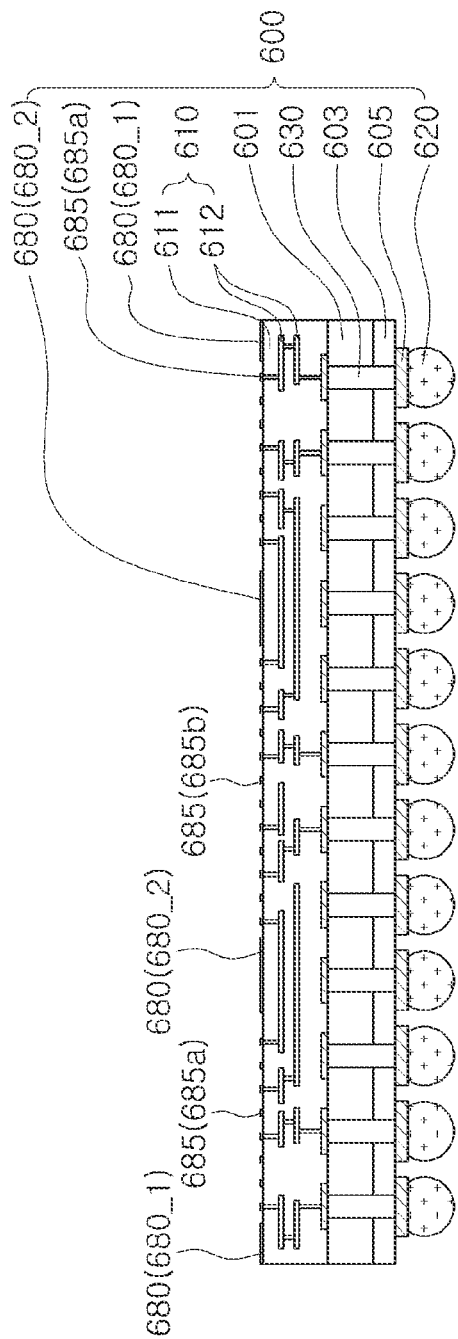

Referring to FIGS. 11A to 11C, a semiconductor package 1000 according to an exemplary embodiment may include a package substrate 500, an interposer 600, and at least one memory structure 300. Also, the semiconductor package 1000 may further include a logic chip or a processor chip 400 disposed adjacent to the memory structure 300, on the interposer 600. The memory structure 300 may be one of the semiconductor packages 1a, 1b, and 1c described with reference to FIGS. 9A to 11C. For example, the memory structure 300 may be the semiconductor package 1a described with reference to FIGS. 9A and 9B.

In some exemplary embodiments, the memory structure 300 may be referred to and described as a first chip structure, a stacked chip structure, or a first semiconductor package, and the logic chip or processor chip 400 may be referred to as and described as a second chip structure or a second semiconductor package, and hereinafter, may be referred to and described as the logic chip 400.

The package substrate 500 may include a lower pad 512 disposed on a lower surface of a body, an upper pad 511 disposed on an upper surface of the body, and a redistribution circuit 513 electrically connecting the lower pad 512 and the upper pad 511. The package substrate 500 may be a support substrate on which the interposer 600, the logic chip 400, and the memory structure 300 are mounted, and may be a substrate for a semiconductor package, including a printed circuit board (PCB), a ceramic substrate, a glass substrate, a tape wiring board, or the like.

The body of the package substrate 500 may include different materials depending on the type of the substrate. For example, when the package substrate 500 is a printed circuit board, the body of the package substrate 500 may have a form in which a wiring layer is additionally laminated on one side or both sides of a body copper clad laminate or a copper clad laminate. A solder resist layer may be formed on a lower surface and an upper surface of the package substrate 500, respectively. The lower and upper pads 512 and 511 and the redistribution circuit 513 may form an electrical path connecting a lower surface and an upper surface of the package substrate 500. The lower and upper pads 512 and 511 and the redistribution circuit 513 may include a metallic material, for example, at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), or an alloy including two or more metals. The redistribution circuit 513 may include multiple redistribution layers and vias connecting the multiple redistribution layers. An external connection terminal 520 connected to the lower pad 512 may be disposed on a lower surface of the package substrate 500. The external connection terminal 520 may include tin (Sn), indium (In), bismuth (Bi), antimony (Sb), copper (Cu), silver (Ag), zinc (Zn), lead (Pb), and/or or an alloy thereof.

The interposer 600 may include a substrate 601, a lower protective layer 603, a lower pad 605, an interconnection structure 610, a bump 620, and a through-electrode 630. The interconnection structure 610 may be referred to as a wiring structure. The memory structure 300 and the logic chip 400 may be stacked on the package substrate 500 via the interposer 600. The interposer 600 may electrically connect the memory structure 300 and the logic chip 400 to each other. In the interposer 600, the substrate 601 may be formed of, for example, any one of silicon, an organic material, a plastic, and a glass substrate. For example, when the substrate 601 is a silicon substrate, the interposer 600 may be referred to as a silicon interposer. In the interposer 600, for example, when the substrate 601 is an organic substrate, the interposer 600 may be referred to as a panel interposer. The lower protective layer 603 may be disposed on the lower surface of the substrate 601, and the lower pad 605 may be disposed below the lower protective layer 603. The lower pad 605 may be connected to the through-electrode 630. The memory structure 300 and the logic chip 400 may be electrically connected to the package substrate 500 through the bumps 620 disposed below the lower pad 605.

The interconnection structure 610 is disposed on the upper surface of the substrate 601 and may include an insulating layer 611 and a single-layer or multilayer interconnection structure 612. For example, when the interconnection structure 610 has a multilayer interconnection structure, wirings on different layers may be connected to each other through vertical contacts.

The through-electrode 630 may extend from an upper surface to a lower surface of the substrate 601 to penetrate through the substrate 601. The through-electrode 630 may extend into the interconnection structure 610 to be electrically connected to wirings of the interconnection structure 610. In the case in which the substrate 601 is formed of silicon, the through-electrode 630 may be referred to as a TSV. According to an exemplary embodiment, the interposer 600 may include only a wiring layer therein, but may not include a through-electrode.

The interposer 600 may be used for converting or transferring an input electrical signal, between the package substrate 500 and the memory structure 300 or the logic chip 400. Accordingly, the interposer 600 may not include elements such as active elements or passive elements. Also, according to an exemplary embodiment, the interconnection structure 610 may be disposed below the through-electrode 630. For example, the positional relationship between the interconnection structure 610 and the through-electrode 630 may be relative.

The bump 620 may be disposed on the lower surface of the interposer 600 and may be electrically connected to the wiring of the interconnection structure 610. The interposer 600 may be stacked on the package substrate 500 through the bump 620. The bump 620 may be connected to the wiring 612 of the interconnection structure 610 through the through-electrode 630 and the lower pad 605. In an example, some pads 605 used for power or grounding among the lower pads 605 may be integrated and connected to the bump 620, and thus, the number of the lower pads 605 may be greater than the number of the bumps 620.

The interposer 600 may include upper pads 685 and upper protrusion patterns 680 on the interconnection structure 610. The upper pads 685 may include a first upper pad 680*a* and a second upper pad 680*a*. The upper protrusion patterns 680 may include a first upper protrusion pattern 680_1 and a second upper protrusion pattern 680_2.

The logic chip 400 may include, for example, a central processor (CPU), a graphics processor (GPU), a field programmable gate array (FPGA), a digital signal processor (DSP), an encryption processor, a microprocessor, a microcontroller, an analog-to-digital converter, an application-specific IC (ASIC), and the like. According to the types of devices included in the logic chip 400, the semiconductor package 1000 may be classified as a server-oriented semiconductor package or a mobile-oriented semiconductor package.

The semiconductor package 1000 may include a first connection pattern 710*a* disposed between the memory structure 300 and the interposer 600 to electrically connect the memory structure 300 and the interposer 600, and a second connection pattern 710*b* disposed between the logic chip 400 and the interposer 600 to electrically connect the logic chip 400 and the interposer 600.

The semiconductor package 1000 may include a first underfill material layer 700*a* filling the space between the memory structure 300 and the interposer 600 and surrounding a side surface of the first connection pattern 710*a*, and a second underfill material layer 700*b* filling the space between the logic chip 400 and the interposer 600 and surrounding a side surface of the second connection pattern 710*b*.

In the interposer 600, the upper protrusion patterns 680 may perform substantially the same function as the upper protrusion pattern 280 of the base 203 described with reference to FIGS. 8A and 8B. For example, the first upper protrusion pattern 680_1 of the upper protrusion patterns 680 may serve to provide stable and reliable formation of the first underfill material layer 700*a* and prevent the first underfill material layer 700*a* from excessively protruding to out of the memory structure 300. In addition, the second upper protrusion patterns 680_2 of the upper protrusion patterns 680 may serve to provide stable and reliable formation of the second underfill material layer 700b and prevent the second underfill material layer 700b from excessively protruding out of the logic chip 400.

Figure 12:
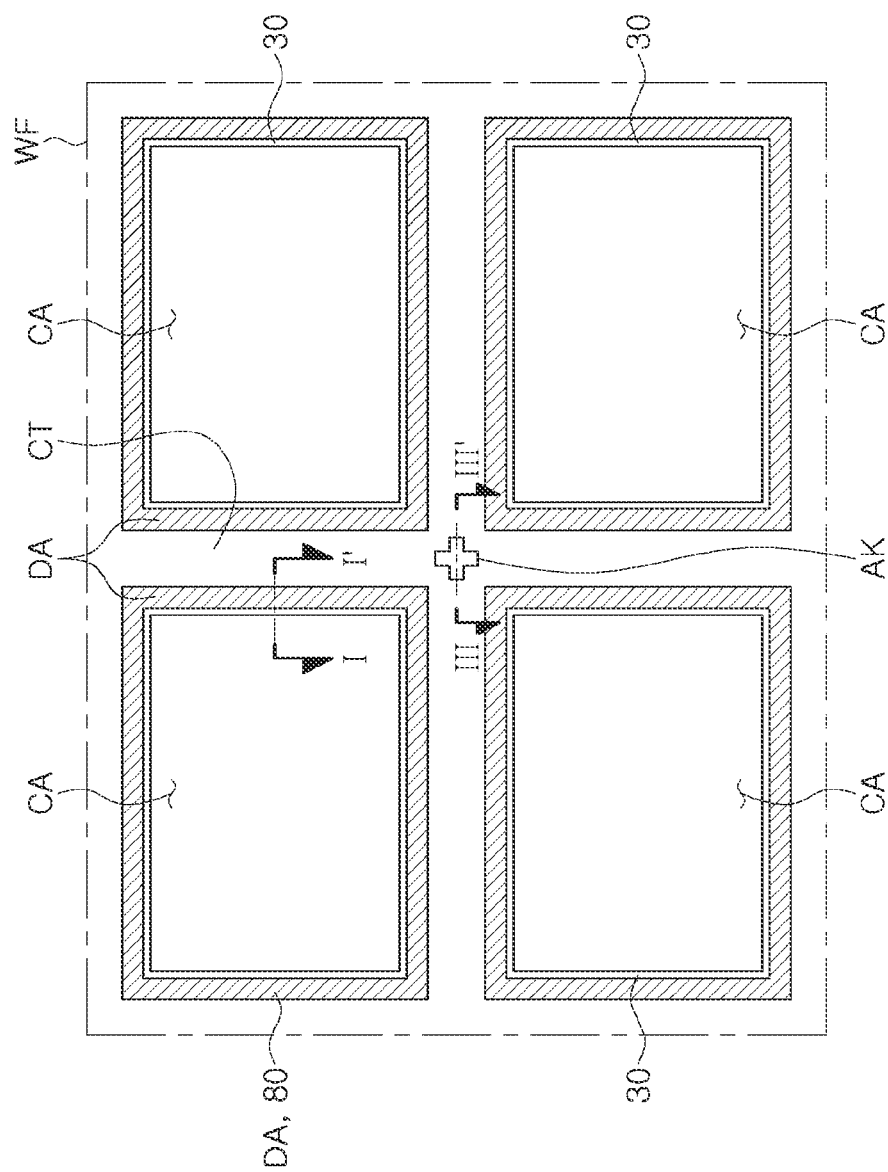
FIGS. 12 to 15 are diagrams illustrating example examples of a method of forming a semiconductor package according to an exemplary embodiment.
Figure 14:
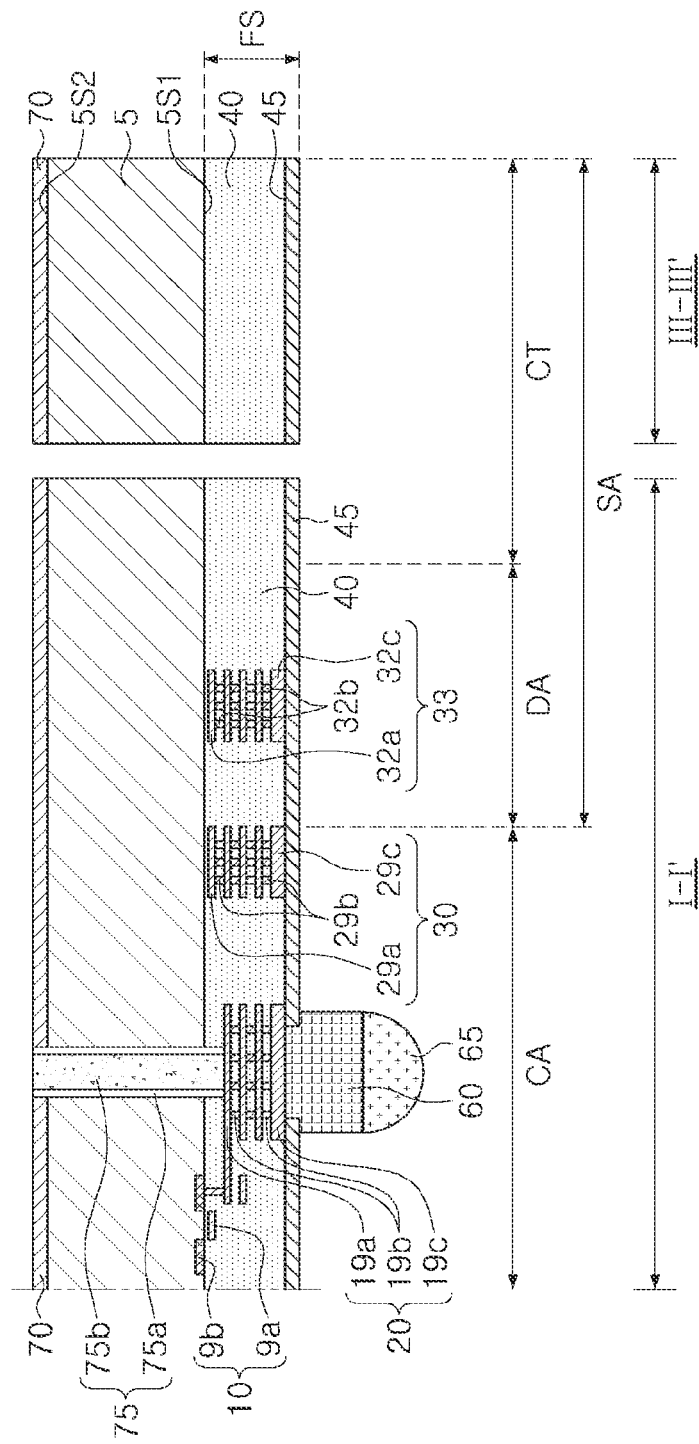
Figure 15:
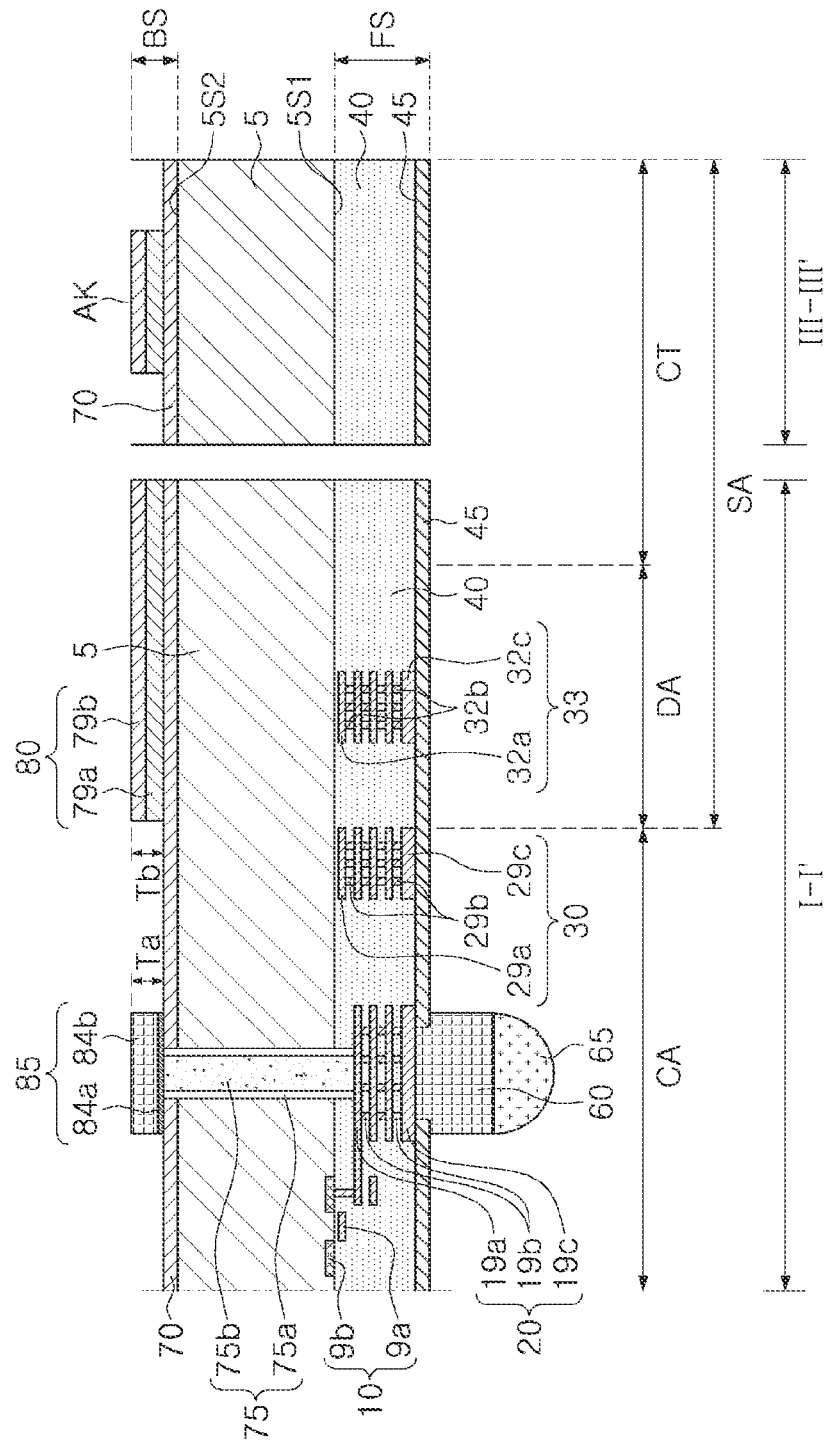

Next, a method of forming a semiconductor package according to an exemplary embodiment will be described with reference to FIGS. 12 to 15, as an example. FIG. 12 is a plan view of a semiconductor wafer illustrated to describe a method of forming a semiconductor package according to an exemplary embodiment, and FIGS. 13 to 15 are cross-sectional views illustrating areas taken along lines I-I' and III-III' of FIG. 12.

Figure 13:
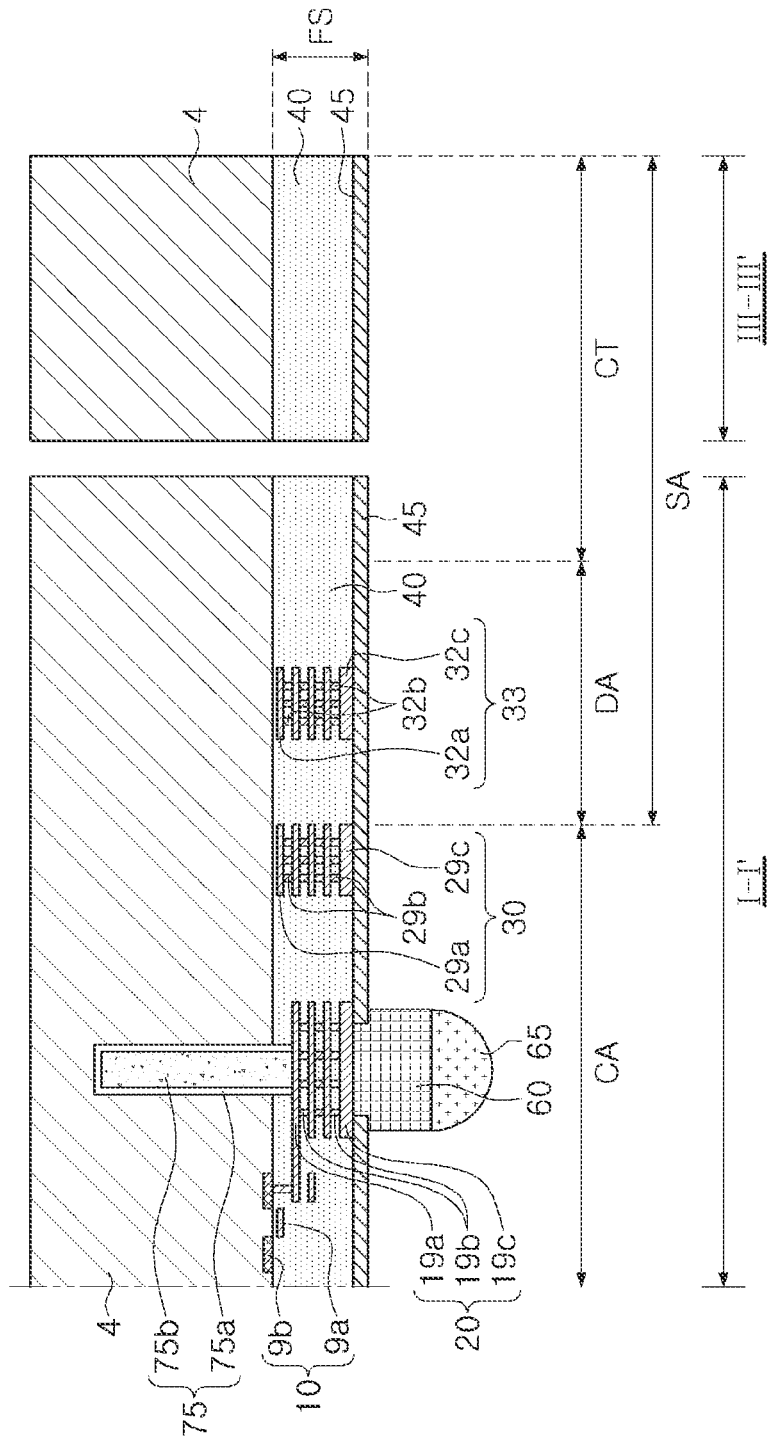

Referring to FIGS. 12 and 13, a semiconductor wafer WF may be formed. A front structure FS may be formed on the front side of the semiconductor wafer WF. The front structure FS may be the front structure FS as described with reference to FIG. 2.

The semiconductor wafer WF may be a semiconductor substrate 4. A through-electrode structure 75 may be formed. For example, after forming a portion of the front structure FS, the through-electrode structure 75 may be formed to penetrate through a portion of the front structure FS and extend into the semiconductor wafer WF and 4.

The front bump 60 and the connection pattern 65 as described with reference to FIG. 2 may be formed below the front structure FS of the semiconductor wafer WF. The connection pattern 65 may include a solder material.

The front structure FS may further include the chipping dams (refer to 33 of FIG. 5) as described with reference to FIG. 5. The semiconductor wafer WF may further include the front protrusion pattern (refer to 47 of FIG. 7) as described with reference to FIG. 7.

The through-electrode structure 75 may not penetrate the semiconductor wafer, for example, the semiconductor substrate 4. The through-electrode structure 75 may include a through-electrode 75b and an insulating spacer 75a covering at least a side surface of the through-electrode 75b.

The semiconductor substrate (WF, 4) may include a plurality of chip areas CA, and a scribe lane area SA between the plurality of chip areas CA.

The scribe lane area SA may include dummy areas DA surrounding each of the plurality of chip areas CA in a ring shape, and a cutting area CT between the dummy areas DA.

Referring to FIGS. 12, 14 and 15, a process for reducing the thickness of the semiconductor substrate 4, for example, a back grinding process, may be performed to form the semiconductor substrate 5 having a reduced thickness. The semiconductor substrate 5 having a reduced thickness may have a front side 5S1 and a back side 5S2, and a portion of the through-electrode structure 75 may be formed to have a shape protruding from the back side 5S2 of the semiconductor substrate 5.

A rear structure BS including a rear protective layer 70, a rear protrusion pattern 80, and a rear alignment key AK may be formed on the back side 5S2 of the semiconductor substrate 5. Forming the rear protective layer 70 may include forming an insulating layer on the back side 5S2 of the semiconductor substrate 5, and then, planarizing the insulating layer until the through-electrode 75b of the through-electrode structure 75 is exposed.

The rear protrusion pattern 80 and the back side alignment key AK may be simultaneously formed on the rear protective layer 70 on the scribe lane area SA. The rear protrusion pattern 80 and the rear alignment key AK may include first and second insulating material layers 79a and 79b sequentially stacked.

The rear protrusion pattern 80 may be formed in various shapes as described with reference to FIGS. 1 to 6.

In another example, forming the rear protective layer 70, the rear protrusion pattern 80, and the rear alignment key AK may include forming a plurality of insulating layers on the back side 5S2 of the semiconductor substrate 5, and patterning the plurality of insulating layers by performing a photo and etching process. For example, forming a plurality of insulating layers on the back side 5S2 of the semiconductor substrate 5, performing a photo and etching process to remove a portion of the plurality of insulating layers in the chip area CA, and forming the alignment key AK in the stripe lane area SA may be included. In this case, the plurality of remaining insulating layers may be formed as the rear protrusion pattern 80, and an insulating layer remaining in a lower portion among the plurality of insulating layers may be formed as the rear protective layer 70.

A rear pad 85 electrically connected to the through-electrode 75b of the through-electrode structure 75 may be formed on the rear protective layer 70. The rear pad 85 may include a first rear layer 84a and a second rear layer 84b on the first rear layer 84a, sequentially stacked.

Again, referring to FIGS. 1 and 2, by performing a sawing process, the semiconductor wafer, for example, the semiconductor substrate 5 may be cut along the cutting area CT of the scribe lane area SA to form a plurality of semiconductor chips 3. Accordingly, the plurality of chip areas (CA of FIG. 12) may be separated from each other. The rear alignment key AK may be removed while cutting the semiconductor wafer. Each of the semiconductor chips 3 may include the front structure FS, the rear protective layer 70, and the rear protrusion pattern 80.

The dummy areas (DA of FIG. 12) surrounding each of the plurality of chip areas (CA of FIG. 12) may remain. Accordingly, the semiconductor chip 3 including one chip area CA and one dummy area DA surrounding the one chip area CA may be formed as illustrated in FIG. 1.

Again, referring to FIGS. 8A and 8B, the semiconductor chips 3 may include a first semiconductor chip and a second semiconductor chip. A first adhesive material layer may be attached to a lower portion of the front structure of the first semiconductor chip, a second adhesive material layer may be attached to a lower portion of the front structure of the second semiconductor chip, and a base 203 may be prepared. The first semiconductor chip to which the first adhesive material layer is attached may be attached to the base, thereby forming the first semiconductor chip 103a and the first adhesive material layer 190a as in FIGS. 8A and 8B. The second semiconductor chip to which the second adhesive material layer is attached may be attached onto the first semiconductor chip 103a, thereby forming the second semiconductor chip 103b and the second adhesive material layer 190b as in FIGS. 8A and 8B. This process may be repeated.

The first adhesive material layer 190a may be disposed between the first semiconductor chip 103a and the base 103a to be in contact with the first semiconductor chip 103a and the base 203. The second adhesive material layer 190b may be disposed between the first semiconductor chip 103a and the second semiconductor chip 103b to be in contact with the first semiconductor chip 103a and the second semiconductor chip 103b.

After repeatedly attaching the semiconductor chip to which the adhesive material layer is attached onto the base 203, a mold layer 195 may be formed, and the mold layer 195 and the base 203 may be cut to form the semiconductor package 1a as illustrated in FIGS. FIG. 8A and FIG. 8B. The mold layer 195 may be formed of an epoxy mold compound (EMC).

In some exemplary embodiments, the rear protrusion patterns 180 may prevent the adhesive material layers 190a, 190b, 190c, 190c and 190d from excessively protruding outwardly of the semiconductor chips 103a, 103b, 103c, and 103d. For example, by the rear protrusion pattern 80 of the first semiconductor chip 103a, the second adhesive material layer 190b may be stably and reliably filled between the first semiconductor chip 103a and the second semiconductor chip 103b. In addition, the second adhesive material layer 190b may serve to prevent excessive protrusion of the first and second semiconductor chips 103a and 103b outwardly.

As set forth above, according to exemplary embodiments, a semiconductor package having improved reliability may be provided by disposing a rear protrusion pattern for stably and reliably forming an adhesive material layer on the back side of a semiconductor chip.

While exemplary embodiments have been illustrated and described above, it will be apparent to those skilled in the art that modifications and variations could be made without departing from the scope of the present inventive concept as defined by the appended claims.

What is claimed is:
1. A semiconductor package comprising:
a base;
a plurality of semiconductor chips stacked on the base in a vertical direction;
connection patterns electrically connecting the plurality of semiconductor chips; and
adhesive material layers filling at least a space between the plurality of semiconductor chips and covering side surfaces of the connection patterns,
wherein the plurality of semiconductor chips include a first semiconductor chip and a second semiconductor chip sequentially stacked in the vertical direction,
the connection patterns include a first connection pattern disposed between the first semiconductor chip and the second semiconductor chip and electrically connecting the first semiconductor chip and the second semiconductor chip, and
the first semiconductor chip includes:
a first semiconductor substrate having a first front side and a first back side opposing each other, the first semiconductor substrate having a first chip area and a first dummy area surrounding the first chip area;
a first front structure disposed below the first front side of the first semiconductor substrate, and including a first internal circuit, a first guard pattern, a first internal connection pattern, and a first front insulating structure;
on the first back side of the first semiconductor substrate, a first rear protective layer overlapping the first chip area and the first dummy area, and a first rear protrusion pattern disposed on the first rear protective layer and overlapping the first dummy area;
a first through-electrode structure penetrating through the first chip area of the first semiconductor substrate and the first rear protective layer, and electrically connected to the first internal connection pattern in the first front structure; and
a first rear pad electrically connected to the first through-electrode structure, on the first rear protective layer and the first through-electrode structure, and spaced apart from the first rear protrusion pattern,
wherein the first internal circuit and the first internal connection pattern are disposed below the first chip area of the first semiconductor substrate, and
the first guard pattern is disposed below the first chip area of the first semiconductor substrate adjacent to the first dummy area.

2. The semiconductor package of claim 1, wherein the first back side of the first semiconductor substrate is substantially flat, and
the first rear protrusion pattern has a flat upper surface substantially parallel to the first back side of the first semiconductor substrate.

3. The semiconductor package of claim 1, wherein the first guard pattern has a ring shape surrounding the first internal circuit and the first internal connection pattern.

4. The semiconductor package of claim 1, wherein the first rear protrusion pattern includes at least two insulating material layers sequentially stacked.

5. The semiconductor package of claim 4, wherein from the at least two insulating material layers of the first rear protrusion pattern, an insulating material layer in contact with the first rear protective layer includes a material different from a material of the first rear protective layer in contact with the first rear protrusion pattern.

6. The semiconductor package of claim 1, wherein a thickness of the first rear protrusion pattern is greater than a thickness of the first rear protective layer.

7. The semiconductor package of claim 1, wherein a thickness of the first rear protrusion pattern is different from a thickness of the first rear pad.

8. The semiconductor package of claim 1, wherein a thickness of the first rear pad is twice or more than a thickness of the first rear protective layer.

9. The semiconductor package of claim 1, wherein the first front structure further includes chipping dams vertically overlapping the first dummy area, and
wherein the chipping dams are disposed outside of the first guard pattern and below the first front side of the first semiconductor substrate.

10. The semiconductor package of claim 1, wherein the second semiconductor chip includes a second semiconductor substrate and a second front structure below the second semiconductor substrate,
the second front structure includes a second internal circuit, a second front insulating structure, and a front protective layer below the second front insulating structure,
the second semiconductor chip further includes a front protrusion pattern below the front protective layer,
the front protrusion pattern facing the rear protrusion pattern,
the adhesive material layers include a first adhesive material layer between the first semiconductor chip and the second semiconductor chip, and
the first adhesive material layer is in contact with the front protrusion pattern and the rear protrusion pattern overlapping the first dummy area in the vertical direction, and is in contact with the first rear protective layer and the front protective layer overlapping the first chip area in the vertical direction.

11. The semiconductor package of claim 1, further comprising:
a package substrate;
an interposer on the package substrate; and
a chip structure on the interposer,
wherein the base is disposed on the interposer and is spaced apart from the chip structure.

12. The semiconductor package of claim 11, wherein at least one of the plurality of semiconductor chips is a memory semiconductor chip, and
the chip structure is a logic chip or a processor chip.

13. A semiconductor package comprising:
a semiconductor substrate having a front side and a back side opposing each other, the semiconductor substrate having a chip area and a dummy area surrounding the chip area;
a front structure disposed below the front side of the semiconductor substrate, and including an internal circuit, an internal connection pattern, a guard pattern, and a front insulating structure;
a rear protective layer overlapping the chip area and the dummy area, and a rear protrusion pattern disposed on the rear protective layer and overlapping the dummy area, the rear protective layer and the rear protrusion pattern being disposed on the back side of the semiconductor substrate;
a through-electrode structure penetrating through the chip area of the semiconductor substrate and the rear protective layer, and electrically connected to the internal connection pattern in the front structure; and
a rear pad electrically connected to the through-electrode structure, on the rear protective layer and the through-electrode structure, and spaced apart from the rear protrusion pattern,
wherein the internal circuit and the internal connection pattern are disposed below the chip area of the semiconductor substrate, and
the guard pattern that is disposed below the chip area of the semiconductor substrate adjacent to the dummy area.

14. The semiconductor package of claim 13, wherein the rear protrusion pattern has a side surface extending from a side surface of the semiconductor substrate,
the back side of the semiconductor substrate being substantially flat, and
the rear protrusion pattern having an upper surface parallel to the back side of the semiconductor substrate.

15. The semiconductor package of claim 13, wherein the rear protrusion pattern includes at least two insulating material layers sequentially stacked, and
an insulating material layer contacting the rear protective layer, from the at least two insulating material layers of the rear protrusion pattern, including a material different from a material of the rear protective layer in contact with the rear protrusion pattern.

16. The semiconductor package of claim 13, wherein the rear protective layer has a thickness of about 1 μm or less, and
the rear protrusion pattern forms a step with the rear protective layer, having a thickness of about 1 μm to about 4 μm.

17. A semiconductor package comprising:
a substrate having a first surface and a second surface opposing each other, the substrate having a first area and a second area surrounding the first area;
a lower structure below the first surface of the substrate;
a conductive pad disposed on the second surface of the substrate and disposed on the first area;
an insulating protrusion pattern disposed on the second surface of the substrate, disposed on the second area, and having a step from the second surface of the substrate;
an upper structure disposed on the second surface of the substrate and having a lower pad;
a connection pattern disposed between the conductive pad and the lower pad, and in contact with the conductive pad and the lower pad; and
an adhesive material layer including a portion filling a space between the conductive pad and the lower pad, surrounding a side surface of the connection pattern and extending to a side surface of the upper structure,
wherein the upper structure includes a semiconductor chip.

18. The semiconductor package of claim 17, wherein the second surface of the substrate is substantially flat, and
the protrusion pattern has a flat upper surface substantially parallel to the second surface of the substrate.

19. The semiconductor package of claim 18, wherein the protrusion pattern has a side surface extending from a side surface of the substrate.

20. The semiconductor package of claim 17, wherein the protrusion pattern includes a first insulating material layer and a second insulating material layer sequentially stacked and having different thicknesses.

* * * * *